(12) United States Patent
Kim et al.

(10) Patent No.: US 12,431,195 B2
(45) Date of Patent: Sep. 30, 2025

(54) SEMICONDUCTOR DEVICE AND DATA STORAGE SYSTEM INCLUDING SEMICONDUCTOR DEVICE

(71) Applicant: Samsung Electronics Co., Ltd., Suwon-si (KR)

(72) Inventors: Jiwon Kim, Suwon-si (KR); Jiyoung Kim, Suwon-si (KR); Woosung Yang, Suwon-si (KR); Dohyung Kim, Suwon-si (KR); Sukkang Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 134 days.

(21) Appl. No.: 18/518,496

(22) Filed: Nov. 23, 2023

(65) Prior Publication Data

US 2024/0194266 A1  Jun. 13, 2024

(30) Foreign Application Priority Data

Dec. 7, 2022  (KR) .................... 10-2022-0169804

(51) Int. Cl.
  *G11C 16/08*  (2006.01)
  *H01L 23/522*  (2006.01)
  (Continued)

(52) U.S. Cl.
  CPC .......... *G11C 16/08* (2013.01); *H01L 23/5226* (2013.01); *H01L 23/5283* (2013.01);
  (Continued)

(58) Field of Classification Search
  CPC ........ G11C 16/08; H10B 43/35; H10B 41/35; H10B 80/00; H10B 41/27; H10B 43/27
  (Continued)

(56) References Cited

U.S. PATENT DOCUMENTS 10,453,857 B2 * 10/2019 Lee .................... H10B 43/27
10,964,638 B2 *  3/2021 Kim .................... H01L 23/528
(Continued)

FOREIGN PATENT DOCUMENTS

| CN | 110998844 A | * | 4/2020 | ............. G11C 16/04 |
|---|---|---|---|---|
| KR | 10-2021-0053824 A | | 5/2021 | |
| KR | 10-2021-0155610 A | | 12/2021 | |
| KR | 10-2022-0042702 A | | 4/2022 | |

*Primary Examiner* — Fernando Hidalgo
(74) *Attorney, Agent, or Firm* — Muir Patent Law, PLLC

(57) ABSTRACT

A semiconductor device includes a first substrate structure including a first decoder circuit region, a second decoder circuit region, and a page buffer circuit region, and a second substrate structure connected to the first substrate structure. The second substrate structure includes a first cell structure that includes first horizontally extending gate electrodes, and a second cell structure that includes second horizontally extending gate electrodes. The second cell structure is disposed below the first cell structure. A first stair structure is disposed to one side of the first and second cell structures, and a second stair structure is disposed to a second side opposite the first side. a dummy structure is disposed below the first stair structure. First contact plugs pass through the first stair structure and the first dummy structure and are respectively connected to the first gate electrodes, and second contact plugs pass through the second stair structure and are respectively connected to the second gate electrodes.

20 Claims, 21 Drawing Sheets

(51) Int. Cl.
   *H01L 23/528*   (2006.01)
   *H01L 25/065*   (2023.01)
   *H10B 41/27*    (2023.01)
   *H10B 41/35*    (2023.01)
   *H10B 43/27*    (2023.01)
   *H10B 43/35*    (2023.01)
   *H10B 80/00*    (2023.01)

(52) U.S. Cl.
   CPC ......... *H01L 25/0652* (2013.01); *H10B 41/27* (2023.02); *H10B 41/35* (2023.02); *H10B 43/27* (2023.02); *H10B 43/35* (2023.02); *H10B 80/00* (2023.02); *H01L 2225/06506* (2013.01)

(58) Field of Classification Search
   USPC ..................................................... 365/185.01
   See application file for complete search history.

(56) References Cited

U.S. PATENT DOCUMENTS

| | | | |
|---|---|---|---|
| 11,469,217 B2* | 10/2022 | Arai | H01L 23/544 |
| 2019/0088589 A1 | 3/2019 | Zhu et al. | |
| 2020/0144242 A1* | 5/2020 | Park | H01L 24/83 |
| 2021/0005593 A1 | 1/2021 | Lee et al. | |
| 2021/0036015 A1* | 2/2021 | Lim | H01L 23/535 |
| 2021/0098367 A1* | 4/2021 | Lee | H10B 43/50 |
| 2021/0217760 A1 | 7/2021 | Yang et al. | |
| 2021/0391289 A1 | 12/2021 | Kim et al. | |
| 2022/0028846 A1 | 1/2022 | Alsmeier et al. | |
| 2022/0102306 A1 | 3/2022 | Ahn et al. | |
| 2022/0122933 A1 | 4/2022 | Hwang et al. | |
| 2022/0189940 A1* | 6/2022 | Park | H01L 24/89 |
| 2023/0154537 A1* | 5/2023 | Song | G11C 16/0483 365/230.06 |

* cited by examiner

SEMICONDUCTOR DEVICE AND DATA STORAGE SYSTEM INCLUDING SEMICONDUCTOR DEVICE

CROSS-REFERENCE TO RELATED APPLICATION(S)

This application claims benefit of priority to Korean Patent Application No. 10-2022-0169804 filed on Dec. 7, 2022 in the Korean Intellectual Property Office, the disclosure of which is incorporated herein by reference in its entirety.

BACKGROUND

The present disclosure relates to a semiconductor device and a data storage system including the same.

In an electronic system requiring data storage, a semiconductor device capable of high-capacity data storage is in demand. Accordingly, there is ongoing research into ways of increasing data storage capacity of semiconductor devices. For example, as a method of increasing data storage capacity of a semiconductor device, arranging memory cells three-dimensionally is an area of ongoing research and development.

SUMMARY

Aspects of the present disclosure provide for improved mass production of a semiconductor device, for example by providing improved structures and techniques for design and manufacture of devices that include two connected substrates in which circuit elements on one substrate interoperate with components on the other substrate.

Aspects of the present disclosure similarly provide a for improved mass production of a data storage system including a semiconductor device.

According to an aspect of the present disclosure, a semiconductor device includes a first substrate structure and a second substrate structure. The first substrate structure has a first decoder circuit region, a second decoder circuit region, a page buffer circuit region between the first decoder circuit region and the second decoder circuit region, and a top surface facing in a first direction. The second substrate structure is connected to the first substrate structure and is on the top surface of the first substrate structure. The second substrate structure has a plate layer, first and second cell structures, first and second stair structures, a dummy structure, and pluralities of first and second contact plugs. The plate layer has a lower surface facing the top surface of the first substrate structure. The first cell structure is below the plate layer and has a plurality of first gate electrodes stacked on and spaced apart from each other in the first direction, a first side facing in a second direction perpendicular to the first direction, and a second side opposite the first side. The second cell structure is below the first cell structure and has a plurality of second gate electrodes stacked on and spaced apart from each other in the first direction, a first side facing in the second direction, and a second side opposite the first side. The first stair structure is adjacent one of the first sides of the first and second cell structures and has portions of at least two of the first gate electrodes extending from the first cell structure to different lengths in the second direction. The second stair structure is adjacent one of the second sides of the first and second cell structures and has portions of at least two of the second gate electrodes extending from the second cell structure to different lengths in the second direction. The dummy structure is below the first stair structure and has portions of the second gate electrodes extending in the second direction. The plurality of first contact plugs passes through the first stair structure and the first dummy structure, and the first contact plugs are respectively connected to the at least two first gate electrodes. The plurality of second contact plugs pass through the second stair structure, and the second contact plugs are respectively connected to the at least two second gate electrodes. The first stair structure overlaps the first decoder circuit region in the first direction, and the second stair structure overlaps the second decoder circuit region in the first direction.

According to another aspect, a semiconductor device includes first and second substrate structures. The first substrate structure has first and second decoder circuit regions, a page buffer circuit region between the first decoder circuit region and the second decoder circuit region, and a top surface facing in a vertical direction. The second substrate structure is connected to the first substrate structure and disposed on the first substrate structure. The second substrate structure has first and second region regions, first and second cell structures, first and second stair structures, and pluralities of first and second contact plugs. The first cell structure includes a plurality of first gate electrodes that are disposed in the first region and stacked in a vertical and spaced apart configuration. The second cell structure includes a plurality of second gate electrodes that are disposed below the first cell structure and stacked in a vertical and spaced apart configuration. The first stair structure is horizontally disposed to a first side of the first and second cell structures, and the first stair structure includes portions of at least some of the first gate electrodes extending horizontally from the first cell structure to different lengths within the first stair structure. The second stair structure is horizontally disposed to a second side of the first and second cell structures opposite the first side and includes portions of at least some of the second gate electrodes extending horizontally from the second cell structure to different lengths within the second stair structure. The plurality of first contact plugs pass vertically through the first stair structure, with each of the first contact plugs respectively connected to a different one of the first gate electrodes. The plurality of second contact plugs pass vertically through the second stair structure, with each of the second contact plugs respectively connected to a different one of the second gate electrodes. In the first stair structure, a length of an upper first gate electrode is longer than a length of a lower first gate electrode, among the first gate electrodes. In the second stair structure, a length of an upper second gate electrode is longer than a length of a lower second gate electrode, among the second gate electrodes.

According to another aspect, a data storage system includes a semiconductor storage device and a controller. The semiconductor storage device has a first substrate structure including circuit elements and first metal bonding pads, a second substrate structure including a plurality of vertically stacked gate electrodes and second metal bonding pads connected to the first metal bonding pads, and an input/output pad electrically connected to the circuit elements. The controller is electrically connected to the semiconductor storage device through the input/output pad, and configured to control the semiconductor storage device. The second substrate structure has first and second regions, a plate layer, first and second cell structures, first and second stair structures, and pluralities of first and second contact plugs. The first cell structure is in the first region and includes a plurality first gate electrodes vertically stacked and spaced apart from each other. The second cell structure is below the first cell structure and includes a plurality of second gate electrodes vertically stacked and spaced apart from each other. The first stair structure is horizontally disposed adjacent a first side of the first and second cell structures and includes portions of at least some of the first gate electrodes extending horizontally from the first cell structure to different lengths. The second stair structure is horizontally disposed adjacent a second side of the first and second cell structures opposite the first side, the second stair structure including portions of at least some of the second gate electrodes extending horizontally from the second cell structure to different lengths. The plurality of first contact plugs pass vertically through the first stair structure and each of the first contact plugs respectively is connected to one of the first gate electrodes. The plurality of second contact plugs pass vertically through the second stair structure and each of the second contact plugs respectively is connected to one of the second gate electrodes. Upper ends of the first and second contact plugs extend vertically above the lower surface of the plate layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
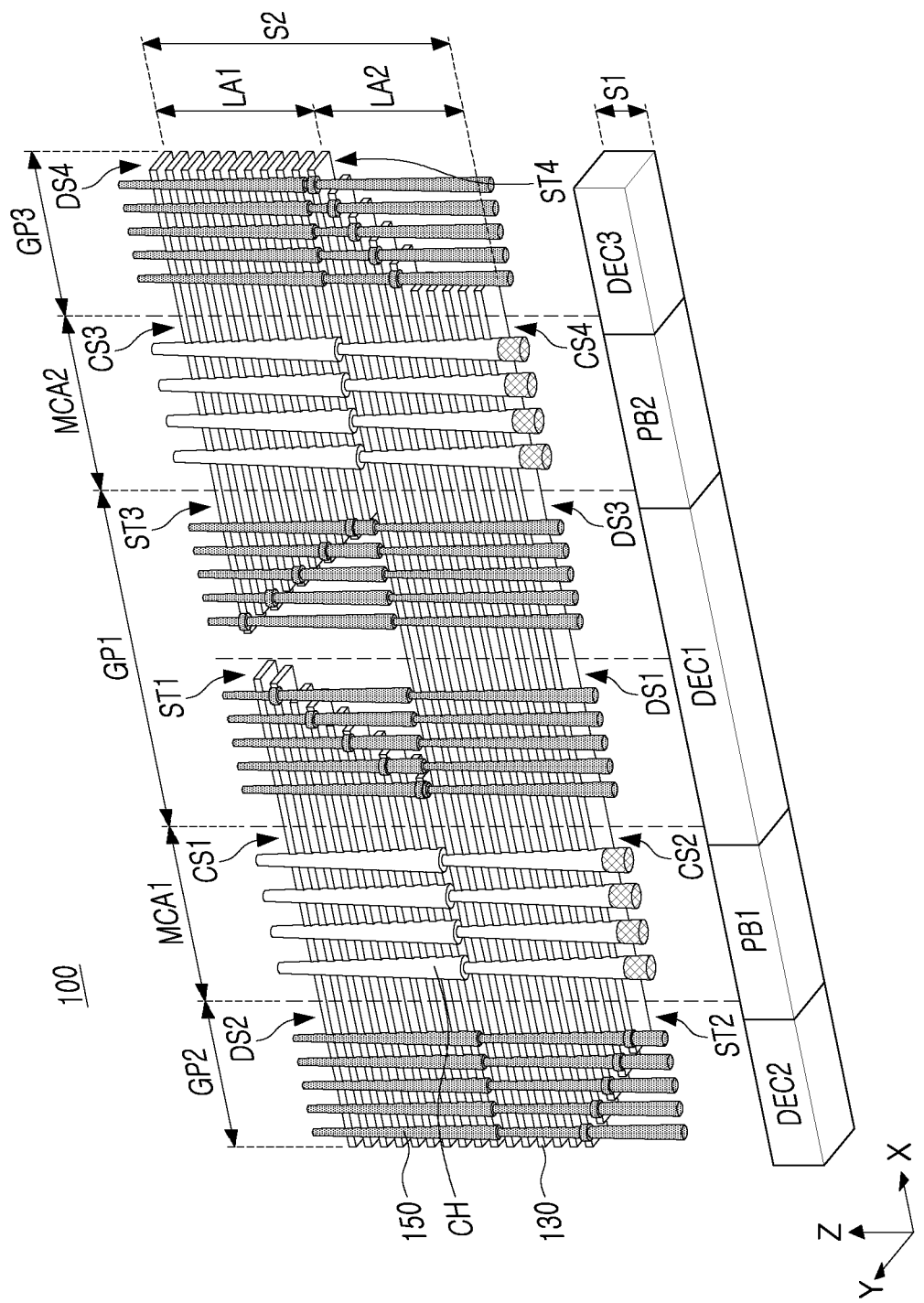
FIG. 1 is a schematic perspective view illustrating a semiconductor device according to example embodiments.

Hereinafter, preferred example embodiments of the present disclosure will be described below with reference to the accompanying drawings. In the descriptions below, terms such as "upper," "upper portion," "upper surface," "lower," "lower portion," "lower surface," "side surface," and the like are used based on the drawings, unless otherwise indicated by reference numerals.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Furthermore, terms such as "same," equal," "planar," "coplanar," "parallel," and "perpendicular," as used herein encompass identicality or near identicality including variations that may occur, for example, due to manufacturing processes. The term "substantially" may be used herein to emphasize this meaning unless the context or other statements indicate otherwise. Also, spatially relative terms, such as "beneath," "below," "lower," "above," "on," "upper," "top," "bottom," and the like, may be used herein for ease of description to describe positional relationships, such as illustrated in the figures, for example. It will be understood that the spatially relative terms encompass different orientations of the device in addition to the orientation depicted in the figures, and a lower surface or portion may be described as an upper surface or portion in relation to different elements at a different point in time (e.g., at a different point in a manufacturing process).

FIG. 1 is a schematic perspective view illustrating a semiconductor device according to example embodiments.

Referring to FIG. 1, a semiconductor device 100 may include first and second substrate structures S1 and S2 stacked in a vertical direction (i.e., direction Z). The first substrate structure S1, a peripheral circuit region, may include first to third decoder circuit regions DEC1, DEC2, and DEC3, and first and second page buffer circuit regions PB1 and PB2. The second substrate structure S2, a memory cell region, may include first and second memory cell regions MCA1 and MCA2 and first to third gate pad regions GP1, GP2, and GP3.

In the first substrate structure S1, the first to third decoder circuit regions DEC1, DEC2, and DEC3 may decode an input address to generate and transmit driving signals of a word line. The first and second page buffer circuit regions PB1 and PB2 may be connected to the first and second memory cell regions MCA1 and MCA2 through bit lines to read information stored in the memory cells. The first substrate structure S1 may further include a logic circuit region in a region not illustrated. The logic circuit region may include control logic and a voltage generator, and may include, for example, a latch circuit, a cache circuit, and/or a sense amplifier.

The first to third decoder circuit regions DEC1, DEC2, and DEC3 may be disposed below the first to third gate pad regions GP1, GP2, and GP3, respectively. The first and second page buffer circuit regions PB1 and PB2 may be disposed below the first and second memory cell regions MCA1 and MCA2, respectively. For example, the first to third decoder circuit regions DEC1, DEC2, and DEC3 may be disposed to overlap the first to third gate pad regions GP1, GP2, and GP3 in a Z-direction, respectively, and the first and second page buffer circuit regions PB1 and PB2 may be disposed to overlap the first and second memory cell regions MCA1 and MCA2 in the Z-direction, respectively.

In the second substrate structure S2, the first and second memory cell regions MCA1 and MCA2, regions in which channel structures CH forming memory cell strings are disposed, may be disposed to be spaced apart from each other with the first gate pad region GP1 interposed therebetween. The second and third gate pad regions GP2 and GP3 may be disposed outside the first and second memory cell regions MCA1 and MCA2, respectively. The first to third gate pad regions GP1, GP2, and GP3 may be regions in which some of the gate electrodes 130 of the first and second memory cell regions MCA1 and MCA2 extend to different lengths in the X-direction to be connected to the contact plugs 150.

In the first and second memory cell regions MCA1 and MCA2 and the first to third gate pad regions GP1, GP2, and GP3, the gate electrodes 130 may form first and second stack structures LA1 and LA2, and may have a multi-stacked form. The number of gate electrodes 130 forming the first stack structures LA1 may be the same as or different from the number of gate electrodes 130 forming the second stack structures LA2. As discussed in more detail below, the channel structures CH and the contact plugs 150 may have a bent shape, e.g., W at an interface between the first and second stack structures LA1 and LA2.

The first memory cell region MCA1 may include a first cell structure CS1 forming a portion of the first stack structure LA1 and a second cell structure CS2 forming a portion of the second stack structure LA2. The second memory cell region MCA2 may include a third cell structure CS3 forming a portion of the first stack structure LA1 and a fourth cell structure CS4 forming a portion of the second stack structure LA2. The first gate pad region GP1 may include first and third stair structures ST1 and ST3 forming portions of the first stack structure LA1. The first stair structure ST1 may be connected to the first cell structure CS1, and the third stair structure ST3 may be connected to the third cell structure CS3. The first gate pad region GP1 may further include first and third dummy structures DS1 and DS3 forming portions of the second stack structure LA2. The second gate pad region GP2 may include a second dummy structure DS2 forming a portion of the first stack structure LA1 and a second stair structure ST2 forming a portion of the second stack structure LA2. The third gate pad region GP3 may include a fourth dummy structure DS4 forming a portion of the first stack structure LA1 and a fourth stair structure ST4 forming a portion of the second stack structure LA2.

In the first to fourth cell structures CS1, CS2, CS3, and CS4, the gate electrodes 130 may horizontally and continuously extend therethrough. In the first to fourth dummy structures DS1, DS2, DS3, and DS4, the gate electrodes 130 may similarly horizontally and continuously extend therethrough.

In at least some of the first to fourth stair structures ST1, ST2, ST3, and ST4, the gate electrodes 130 may extend to different lengths in one direction, for example, an X-direction to form a stair shape. Slope directions of the first to fourth stair structures ST1, ST2, ST3, and ST4 may be symmetrical with respect to the vertical axis (Z-direction) of the first and second memory cell regions MCA1 and MCA2. For example, the slope direction of the first stair structure ST1 may be toward an upper right side, and the slope direction of the second stair structure ST2 may symmetrically be toward an upper left side. At least some of the first to fourth stair structures ST1, ST2, ST3, and ST4 may have different stair structure heights. For example, stair structure heights of the first and third stair structures ST1 and ST3, that is, a height of a region in which the gate electrodes 130 form a stair structure, may be greater than stair structure heights of the second and fourth stair structures ST2 and ST4.

In the first and third stair structures ST1 and ST3, all gate electrodes 130 extending through the first stack structure LA1 may form the stair shapes. As the vertical distance of a gate electrode 130 from the first substrate S1 increases, each gate electrode 130 used to form the stair structure may extend horizontally past the gate electrodes 130 below it. In the second stair structure ST2, the gate electrodes 130 may extend horizontally to different lengths in a lower region thereof to form a stair shape. In the fourth stair structure ST4, the gate electrodes 130 may extend to different lengths in an upper region thereof to form a stair shape. In the first to fourth stair structures ST1, ST2, ST3, and ST4, the gate electrodes 130 having a lower surface exposed downwards (i.e., gate electrodes that extend horizontally past an adjacent gate electrode) may be physically and electrically connected to contact plug 150. While the stair structures ST1 and ST3 are each shown to be formed using all gate electrodes 130 extending through the memory cell regions MCA1 and MCA2 in the first stack structure LA1, and the stair structures ST2 and ST4 are each shown to be formed using half of the gate electrodes 130 extending through memory cell regions MCA1 and MCA2 in the second stack structure LA2, other embodiments may use different groupings of gate electrodes 130 to form stair shapes.

The contact plugs 150 may extend vertically while passing through the first to fourth stair structures ST1, ST2, ST3, and ST4. Each of the contact plugs 150 extending through the first and third stair structures ST1 and ST3 may be connected to, for example, every other adjacent gate electrode 130 in each of the first and third stair structures ST1 and ST3. For example, the contact plugs 150 may be connected to even-numbered gate electrodes 130 from the plate layer 101 in the first stair structures ST1, and may be connected to odd-numbered gate electrodes 130 from the plate layer 101 in the third stair structures ST3. The contact plugs 150 extending through the second and fourth stair structures ST2 and ST4 may be connected to, for example, adjacent gate electrodes 130 in respective lower and upper regions of the stair structures ST2 and ST4. The contact plugs 150 may be connected to the gate electrodes 130 in every layer in a lower region of the gate electrodes 130 in the second stair structure ST2, and the contact plugs 150 may be connected to the gate electrodes 130 in every layer in an upper region of the gate electrodes 130 in the fourth stair structure ST4.

The contact plugs 150 may electrically connect the gate electrodes 130 to circuit elements of the first to third decoder circuit regions DEC1, DEC2, and DEC3 therebelow. The contact plugs 150 may further pass through the first to fourth dummy structures DS1, DS2, DS3, and DS4. Specifically, the contact plugs 150, passing through the first and third stair structures ST1 and ST3, may further pass through the first and third dummy structures DS1 and DS3 therebelow, respectively. The contact plugs 150, passing through the second and fourth stair structures ST2 and ST4, may further pass through the second and fourth dummy structures DS2 and DS4 thereabove, respectively.

In the semiconductor device 100, the first and second stair structures ST1 and ST2 may be respectively disposed in different regions with the first and second cell structures CS1 and CS2 interposed therebetween in the X-direction, and the third and fourth stair structures ST3 and ST4 may be disposed in different regions with the third and fourth cell structures CS3 and CS4 similarly interposed therebetween. Thus, stair structures having slopes in different directions, with the cell structures of one memory cell region interposed therebetween, may be connected to different decoder circuit regions, respectively. Specifically, the first and second stair structures ST1 and ST2 may be electrically connected via the vertical contact plugs 150 that extend through those stair structures to the first and second decoder circuit regions DEC1 and DEC2, respectively, and the third and fourth stair structures ST3 and ST4 may be electrically connected via the vertical contact plugs 150 that extend through those stair structures to the first and third decoder circuit regions DEC1 and DEC3, respectively. A region of the first decoder circuit region DEC1 electrically connected to the first stair structure ST1 may be distinguished from a region of the first decoder circuit region DEC1 electrically connected to the third stair structure ST3. The first to fourth stair structures ST1, ST2, ST3, and ST4 and the first to third decoder circuit regions DEC1, DEC2, and DEC3 may be disposed in this manner. This increases freedom in design and layout and reduces difficulty of the manufacturing process to improve mass production.

Figure 2:
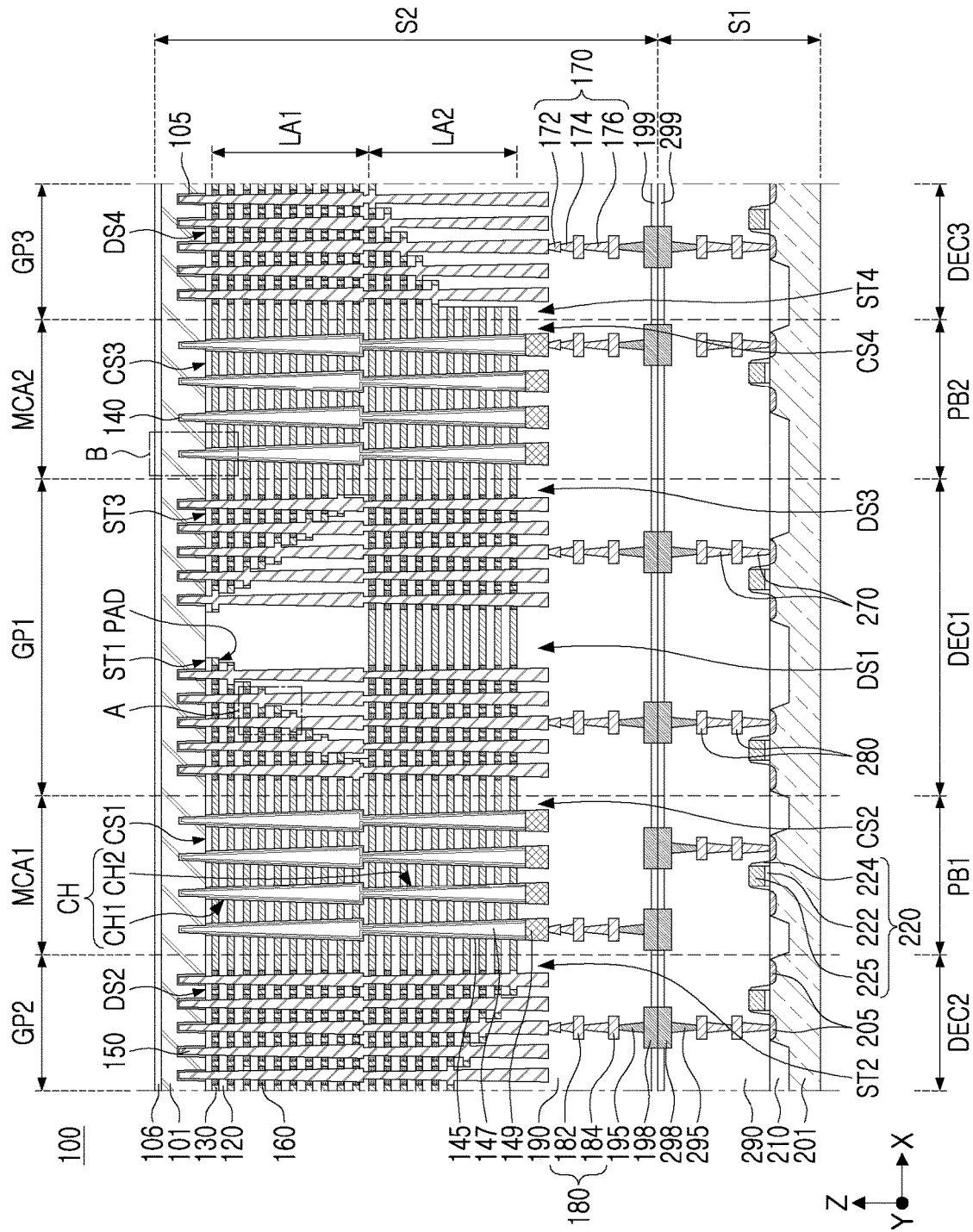
FIG. 2 is a schematic cross-sectional view of a portion of a semiconductor device according to example embodiments.

FIG. 2 is a schematic cross-sectional view of a semiconductor device according to example embodiments.

Figure 3A:
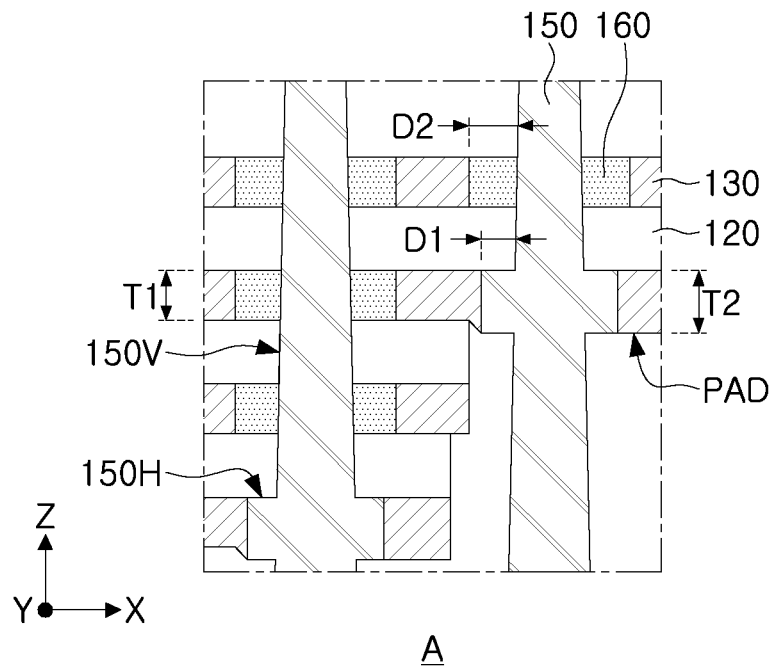
FIGS. 3A and 3B are partial enlarged views of regions A and B of FIG. 2.
Figure 3B:
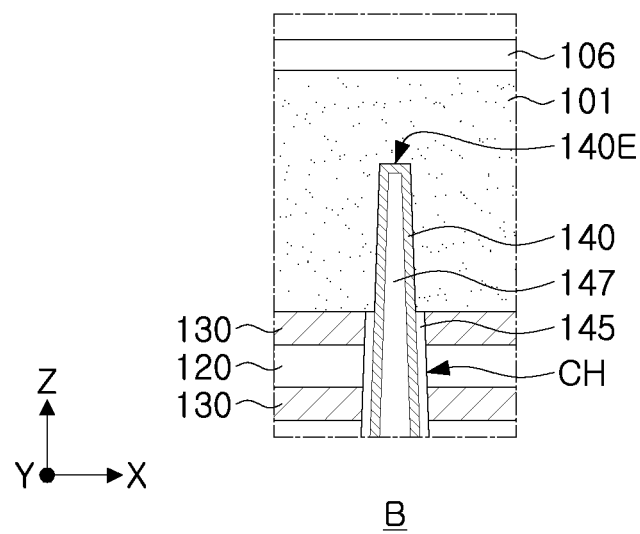

FIGS. 3A and 3B are partial enlarged views of a semiconductor device according to example embodiments. FIG. 3A is an enlarged view of region "A" of FIG. 2, and FIG. 3B is an enlarged view of region "B" of FIG. 2.

Referring to FIGS. 2 to 3B, the semiconductor device 100 may include first and second substrate structures S1 and S2 stacked vertically. The first substrate structure S1 may correspond to the first substrate structure S1 of FIG. 1 and may include a peripheral circuit region. The second substrate structure S2 may correspond to the second substrate structure S2 of FIG. 1 and may include a memory cell region. Hereinafter, descriptions overlapping those described above with reference to FIG. 1 will generally be omitted.

The first substrate structure S1 may include a substrate 201, source/drain regions 205 and element isolation layers 210 in the substrate 201, and circuit elements 220 disposed on the substrate 201, circuit contact plugs 270, circuit interconnection lines 280, peripheral region insulating layer 290, first bonding vias 295, first metal bonding pads 298, and a first bonding insulating layer 299.

The substrate 201 may have an upper surface extending in an X-direction and a Y-direction. The element isolation layers 210 may be formed on the substrate 201 to define active regions. The source/drain regions 205, including doped impurities, may be disposed in a portion of the active region. The substrate 201 may include a semiconductor material, such as a group IV semiconductor, a group III-V compound semiconductor, or a group II-VI compound semiconductor. For example, the substrate 201 may be provided as a single crystal bulk wafer or a portion thereof.

The circuit elements 220 may include planar transistors, and the circuit elements 220 may be disposed in first to third decoder circuit regions DEC1, DEC2, and DEC3, and in first and second page buffer circuit regions PB1 and PB2, respectively. The circuit elements 220 disposed in the first to third decoder circuit regions DEC1, DEC2, and DEC3 may include pass transistors for applying a voltage to the gate electrodes 130 during operation of the semiconductor device 100. Each of the circuit elements 220 may include a gate dielectric layer 222, spacer layers 224, and a gate electrode 225. In the substrate 201, the source/drain regions 205 may be disposed on both sides of the gate electrode 225.

On the substrate 201, the peripheral region insulating layer 290 may be disposed on the circuit element 220. The peripheral region insulating layer 290 may include a plurality of insulating layers formed in different process operations. The peripheral region insulating layer 290 may be or include an insulating material.

The circuit contact plugs 270 and the circuit interconnection lines 280 may form a first interconnection structure of the first substrate structure S1. The circuit contact plugs 270 may have a cylindrical shape, and may pass through the peripheral insulating layer 290 to be connected to the source/drain regions 205. An electrical signal may be applied to the circuit element 220 through the circuit contact plugs 270. In a region not illustrated, the circuit contact plugs 270 may also be connected to the circuit gate electrode 225. The circuit interconnection lines 280 may be connected to the circuit contact plugs 270, may have a linear shape that extends in a horizontal direction (e.g., the Y-direction as illustrated in FIG. 2), and may be disposed in a plurality of layers. The circuit contact plugs 270 and the circuit interconnection lines 280 may be or include a conductive material, for example, tungsten (W), copper (Cu), aluminum (Al), and the like, and respective components may further include a diffusion barrier. In example embodiments, the number of layers of the circuit contact plugs 270 and the circuit interconnection lines 280 may be changed in various manners.

The first bonding vias 295, the first metal bonding pads 298, and the first bonding insulating layer 299 may form a first bonding structure, and may be disposed on the circuit interconnection lines 280. The first bonding vias 295 may have a cylindrical shape or the shape of a frustum, and the first metal bonding pads 298 may have a generally rectilinear shape or surface. Upper surfaces of the first metal bonding pads 298 may be adjacent and/or coplanar with an upper surface of the first substrate structure S1. The metal bonding pads 298 may also be described collectively as a bonding metal layer including a plurality of planar bonding metal components. The first bonding vias 295 and the first metal bonding pads 298 may provide an electrical connection path between the first substrate structure S1 and the second substrate structure S2. Some of the first metal bonding pads 298 may be disposed only for bonding, without being connected to the circuit interconnection lines 280 on a lower portion thereof, while other metal bonding pads 298 may be used for bonding and may also electrically connect to circuit interconnection lines 280 and be configured to pass electrical signals between circuit interconnection lines 280 and other circuit components. The first bonding vias 295 and the first metal bonding pads 298 may include or be a conductive material, for example, copper (Cu). The first bonding insulating layer 299 may be disposed on sides or circumferences of the first metal bonding pads 298. The first bonding insulating layer 299 may also function as diffusion barriers for the first metal bonding pads 298, and may include, for example, at least one of SiN, SiON, SiCN, SiOC, SiOCN, and SiO.

In the first to third decoder circuit regions DEC1, DEC2, and DEC3, at least some of the circuit contact plugs 270 and the circuit interconnection lines 280 may be disposed to overlap the contact plugs 150 of the second substrate structure S2 in a Z-direction. For example, the circuit contact plugs 270 and the circuit interconnection lines 280 may be disposed on a straight line with (e.g., directly vertically below) the contact plugs 150. Similarly, in the first to third decoder circuit regions DEC1, DEC2, and DEC3, at least some of the first bonding vias 295 and the first metal bonding pads 298 may also be disposed to overlap the contact plugs 150 of the second substrate structure S2 in the Z-direction. Accordingly, an electrical path between the gate electrodes 130 and the circuit elements 220 may be minimized.

The second substrate structure S2 may include a plate layer 101, gate electrodes 130 stacked on a lower surface of the plate layer 101, interlayer insulating layers 120 stacked alternately with the gate electrodes 130, channel structures CH disposed to pass through the gate electrodes 130 in the first and second memory cells regions MCA1 and MCA2, and contact plugs 150 disposed to pass through the gate electrodes 130 in first to third gate pad regions GP1, GP2, and GP3. The second substrate structure S2 may further include cell contact plugs 170 and cell interconnection lines 180, as a second interconnection structure, and may further include second bonding vias 195, second metal bonding pads 198, and a second bonding insulating layer 199, as a second bonding structure. The second substrate structure S2 may further include upper insulating layers 105, contact insulating layers 160, a cell region insulating layer 190, and a passivation layer 106.

The first and second memory cell regions MCA1 and MCA2, regions in which the gate electrodes 130 are vertically stacked and the channel structures CH are disposed, may be regions in which memory cells are disposed. The first to third gate pad regions GP1, GP2, and GP3, regions in which the gate electrodes 130 extend to different lengths to form pads PAD on different levels in the second substrate structure S2, may correspond to regions for electrically connecting the memory cells to the first substrate structure S1. The first to third gate pad regions GP1, GP2, and GP3 may be positioned adjacent the first and second memory cell regions MCA1 and MCA2 in at least one direction, for example, the X-direction.

The plate layer 101 may have an upper surface extending in the X-direction and the Y-direction. The plate layer 101 may function as a common source line of the semiconductor device 100. The plate layer 101 may include or be formed using a conductive material. For example, the plate layer 101 may include a semiconductor material, for example, a group IV semiconductor, a group III-V compound semiconductor, or a group II-VI compound semiconductor. For example, the group IV semiconductor may include silicon, germanium, or silicon-germanium. The plate layer 101 may further include impurities. The plate layer 101 may be provided as a polycrystalline semiconductor layer, such as a polycrystalline silicon layer, or an epitaxial layer.

The gate electrodes 130 may be stacked on a lower surface of the plate layer 101 to be vertically spaced apart from each other, thereby forming first and second stack structures LA1 and LA2, together with the interleaved interlayer insulating layers 120. The first and second stack structures LA1 and LA2 may be vertically stacked. The first and second channel structures CH1 and CH2 may extend vertically through the first and second stack structures LA1 and LA2, respectively.

The gate electrodes 130 may include at least one lower gate electrode forming a gate of a ground selection transistor, memory gate electrodes forming a plurality of memory cells, and upper gate electrodes forming gates of string selection transistors. Here, the lower gate electrode and the upper gate electrodes may respectively be referred to as "lower portion" and "upper portion" with respect to a direction during a manufacturing process. The number of the memory gate electrodes forming memory cells may be determined depending on a desired capacity of the semiconductor device 100. In some example embodiments, the number of the lower gate electrodes may be 1 to 4 or more. The lower gate electrodes and the upper gate electrodes each may have a structure the same as or different from that of the memory gate electrodes. In example embodiments, the gate electrodes 130 may further include a gate electrode 130 disposed below the upper gate electrodes and/or on the lower gate electrode used for forming an erase transistor used for an erase operation using a gate induced drain leakage (GIDL) phenomenon.

The gate electrodes 130 may be stacked to be vertically spaced apart from each other, and may form a step structure in the X-direction that results in the formation of stair structures in the first to third gate pad regions GP1, GP2, and GP3. The gate electrodes 130 may be disposed to have a step structure in the Y-direction as well. Due to the step structure, the gate electrodes 130 may respectively have regions having lower surfaces exposed downwards from the interlayer insulating layers 120 and other gate electrodes 130 due to an upper gate electrode 130 extending to be longer than a lower gate electrode 130, and the regions may be referred to as pads PAD, as illustrated in FIGS. 2 and 3A. In each gate electrode 130, the pads PAD may be a region including an end of the gate electrode 130 in the X-direction. The gate electrodes 130 may be connected to the contact plugs 150 in at least some of the pads PAD. In the first and third stair structures ST1 and ST3, lengths of the pads PAD may be different from each other, but the present disclosure is not limited thereto. For example, pads PAD connected to the contact plugs 150 may have a relatively longer length, and pads PAD not connected to the contact plugs 150 may have a relatively shorter length. The gate electrodes 130 may have an increased thickness in the pads PAD. As illustrated in FIG. 3A, the gate electrodes 130 may extend to have a first thickness T1 away from the pads PAD, and may have a second thickness T2 greater than the first thickness T1 in the pads PAD.

In the first to fourth dummy structures DS1, DS2, DS3, and DS4, the gate electrodes 130 may not be used to form a memory cell string, and may not be connected to the contact plugs 150. Accordingly, portions of the gate electrodes 130 extending to the first to fourth dummy structures DS1, DS2, DS3, and DS4 may be considered dummy portions.

The gate electrodes 130 may include a metal material, for example, tungsten (W). In some example embodiments, the gate electrodes 130 may include polycrystalline silicon or a metal silicide material. In example embodiments, the gate electrodes 130 may further include a diffusion barrier. For example, the diffusion barrier may include tungsten nitride (WN), tantalum nitride (TaN), titanium nitride (TiN), or combinations thereof.

The interlayer insulating layers 120 may be disposed between the gate electrodes 130. In the same manner as the gate electrodes 130, the interlayer insulating layers 120 may also be disposed to be spaced apart from each other in a direction, perpendicular to a lower surface of the plate layer 101, and to extend in the X- and Y-directions. The interlayer insulating layers 120 may include or be an insulating material such as silicon oxide or silicon nitride.

In the first and second memory cell regions MCA1 and MCA2, the channel structures CH may be disposed to be spaced apart from each other while forming a grid defining rows and columns on the lower surface of the plate layer 101. The channel structures CH alternatively may be disposed to form a lattice pattern or to have a zigzag shape in one direction. The channel structures CH may have a columnar shape, or may have other shapes such as a conal frustum, with inclined side surfaces such that a width thereof decreases as a distance to the plate layer 101 decreases, e.g., depending on an aspect ratio. In example embodiments, some of the channel structures CH may be dummy channels not used for forming a memory cell string. For example, some of the channel structures CH may be dummy channels disposed to be adjacent to the first to third gate pad regions GP1, GP2, and GP3.

Each of the channel structures CH may have a form in which first channel structures CH1, passing through the first and third cell structures CS1 and CS3 of the gate electrodes 130, and second channel structures CH2, passing through the second and fourth cell structures CS2 and CS4, are connected to each other. A channel structure CH may have a bent portion due to a difference or change in width in a connection region.

Each of the channel structures CH may include a channel layer 140, a gate dielectric layer 145, a channel filling insulating layer 147, and a channel pad 149 disposed in a channel hole. The channel layer 140 may be formed to have an annular cross-sectional shape in the plane perpendicular to the Z-direction, surrounding the inner channel filling insulating layer 147. However, in some example embodiments, the channel layer 140 may have a columnar shape such as a cylindrical shape or a prismatic shape, without the channel filling insulating layer 147. The channel layer 140 may include or be a semiconductor material such as polycrystalline silicon or single-crystalline silicon. The channel layer 140 may be exposed through an upper end thereof to be connected to the plate layer 101.

As illustrated in FIG. 3B, at the upper end of the channel structure CH, an upper end 140E of the channel layer 140 may not be covered by the channel dielectric layer 145. The upper end 140E of the channel layer 140 may include an upper surface and an upper region of a side surface connected to the upper surface. The upper end 140E of the channel layer 140 may be in direct contact with the plate layer 101, and may be surrounded by the plate layer 101. Through such an arrangement, the channel layer 140 may be physically and electrically connected to the plate layer 101.

The gate dielectric layer 145 may be disposed between the gate electrodes 130 and the channel layer 140. Although not specifically illustrated, the gate dielectric layer 145 may include a tunneling layer, a charge storage layer, and a blocking layer sequentially stacked from the channel layer 140. The tunneling layer may tunnel charges to the charge storage layer, and may include or be, for example, silicon oxide ($SiO_2$), silicon nitride ($Si_3N_4$), silicon oxynitride (SiON), or combinations thereof. The charge storage layer may be a charge trapping layer or a floating gate conductive layer. The blocking layer may include or be silicon oxide ($SiO_2$), silicon nitride ($Si_3N_4$), silicon oxynitride (SiON), a high-κ dielectric material, or combinations thereof. In example embodiments, at least a portion of the gate dielectric layer 145 may extend in a horizontal direction along the gate electrodes 130.

The channel pad 149 may be disposed only on a lower end of the lower second channel structure CH2. The channel pad 149 may include, for example, doped polycrystalline silicon.

The channel layer 140, the gate dielectric layer 145, and the channel filling insulating layer 147 may be connected to each other between the first channel structure CH1 and the second channel structure CH2. A relatively thick interlayer insulating layer 120 may be disposed at the interface between the first channel structure CH1 and the second channel structure CH2. However, in example embodiments, the thickness and form of the interlayer insulating layers 120 may be changed in various manners.

The contact plugs 150 may pass through the first to fourth stair structures ST1, ST2, ST3, and ST4, and may pass through the pads PAD of the gate electrodes 130. For example, at least one of the contact plugs 150 may be disposed adjacent some of the pads PAD. The contact plugs 150 may extend through the first to fourth stair structures ST1, ST2, ST3, and ST4 and the first to fourth dummy structures DS1, DS2, DS3, and DS4. The contact plugs 150 may be disposed on the same level or a similar level as each other. Upper surfaces of the contact plugs 150 are coplanar and lower surfaces of the contact plugs 150 are coplanar. Lower ends of the contact plugs 150 may be positioned on substantially the same level, and may be positioned on a level substantially the same as that of lower ends of the channel structures CH. Upper ends of the contact plugs 150 may be positioned on the lower surface of the plate layer 101, for example, at the lower surface or in the plate layer 101. The upper ends of the contact plugs 150 may be positioned on a level the same as or higher than that of the lower surface of the plate layer 101. The contact plugs 150 may have inclined side surfaces such that a width thereof decreases as a distance to the plate layer 101 decreases. The contact plugs 150 may have a bent portion having a width changed between a lowermost gate electrode 130 of the first stack structure LA1 and an uppermost gate electrode 130 of the second stack structure LA2. The contact plugs 150 may have a bent portion having a width changed between the first to fourth stair structures ST1, ST2, ST3, and ST4 and the first to fourth dummy structures DS1, DS2, DS3, and DS4, respectively. In various embodiments, the bent portion can include an abrupt width change in a direction generally perpendicular to the vertical axis of the contact plug 150, as illustrated in FIG. 1. In various embodiments, the bent shape may comprise a flat, concave, or convex surface that faces at least in part in the Z-direction in the region of CH where CH1 is connected to CH2.

The contact plugs 150 may electrically connect the gate electrodes 130 to the circuit elements 220 in the first to third decoder circuit regions DEC1, DEC2, and DEC3 of the first substrate structure S1. The contact plugs 150 may be connected to every other pad PAD in the first and third stair structures ST1 and ST3, and may be connected to all pads PAD disposed in each of lower and upper regions of the second and fourth stair structures ST2 and ST4. The contact plugs 150 may be physically and electrically connected to the respective pads PAD of the gate electrodes 130 to apply an electrical signal to the gate electrodes 130. The contact plugs 150 may be formed of a conductive material, for example, tungsten (W), aluminum (Al), copper (Cu), tungsten nitride (WN), tantalum nitride (TaN), titanium nitride (TiN), or combinations thereof.

As illustrated in FIG. 3A, the contact plugs 150 may have a portion extending horizontally to connect with the pads PAD. Each of the contact plugs 150 may include a vertical extension 150V extending in the Z-direction and a horizontal extension 150H extending horizontally from the vertical extension 150V to be in contact with the gate electrode 130. The horizontal extension 150H may be disposed along a circumference of the vertical extension 150V, and may extend in a first dimension (distance) D1 from a side surface of the vertical extension 150V to the other end adjacent a gate electrode 130. The first dimension D1 may be less than a second dimension D2, which as illustrated in FIG. 3A is the horizontal thickness of the contact insulating layer 160 between the contact plug 150 and the gate electrode 130 that is disposed on top of the interlayer insulating layer 120 (that is disposed on top of the horizontal extension 150H defining dimension D1). The contact plugs 150 may be spaced apart from the gate electrodes 130 adjacent the pads PAD by the contact insulating layers 160. Thus, the gate electrodes 130 are electrically isolated from the contact plugs by the contact insulating layers 160.

The contact insulating layers 160 may be spaced apart from each other in the Z-direction. The upper insulating layers 105 may be further disposed on the upper ends of the contact plugs 150, and thus the plugs may be electrically isolated from the plate layer 101. In example embodiments, a specific shape of the upper insulating layers 105 is not limited to that illustrated in FIG. 2. For example, in other embodiments, the upper insulating layers 105 may extend along the lower surface of the plate layer 101 between the contact plugs 150 to be connected to each other.

The cell region insulating layer 190 may be disposed to vertically overlap the lower surface of the plate layer 101 and the gate electrodes 130 on the lower surface of the plate layer 101. The passivation layer 106 may be disposed on an upper surface of the plate layer 101. The passivation layer 106 may function as a layer protecting the semiconductor device 100. The cell region insulating layer 190 and the passivation layer 106 may include at least one of an insulating material, for example, silicon oxide, silicon nitride, and silicon carbide, and may include a plurality of insulating layers in some example embodiments.

As discussed above, the second interconnection structure may include cell contact plugs 170 and cell interconnection lines 180. The second interconnection structure may allow the second substrate structure S2 to be electrically connected to the first substrate structure S1. The cell contact plugs 170 may include first to third cell contact plugs 172, 174, and 176, and the cell interconnection lines 180 may include first and second cell interconnection lines 182 and 184.

The first cell contact plugs 172 may each be connected either to the channel structures CH at lower ends of the channel pads 149 or to the contact plugs 150. The first cell contact plugs 172 may be connected to the second cell contact plugs 174 at lower ends thereof, and the second cell contact plugs 174 may be connected to the first cell interconnection lines 182 at lower ends thereof. The third cell contact plugs 176 may vertically connect the first and second cell interconnection lines 182 and 184 to each other. The cell contact plugs 170 may have a cylindrical or conal frustum shape. The cell contact plugs 170 may have different lengths, and the lengths of the cell contact plugs 170 are not limited to the relative lengths illustrated in FIG. 2. In example embodiments, the cell contact plugs 170 may have inclined side surfaces such that a width thereof decreases as a distance to the plate layer 101 and the width increases toward the first substrate structure S1, e.g., depending on an aspect ratio.

The cell interconnection lines 180 may include bit lines of the first and second memory cell regions MCA1 and MCA2 connected to the channel structures CH and interconnection lines of the first to third gate pad regions GP1, GP2, and GP3 disposed at the same vertical level as that of the bit lines. The second cell interconnection lines 184 may be interconnection lines disposed below the first cell interconnection lines 182. The cell interconnection lines 180 may have a generally rectilinear shape or surface extending in at least one direction. In some example embodiments, the second cell interconnection lines 184 may have a thickness greater than that of the first cell interconnection lines 182. Although not specifically illustrated, the cell interconnection lines 180 may have inclined side surfaces such that a width thereof decreases toward the plate layer 101.

The cell contact plugs 170 and the cell interconnection lines 180 may include or be formed using a metal material, for example, tungsten (W), aluminum (Al), copper (Cu), tungsten nitride (WN), tantalum nitride (TaN), titanium nitride. (TiN), or combinations thereof.

The second bonding vias 195 of the second bonding structure may be disposed below and connected to the second cell interconnection lines 184, and the second metal bonding pads 198 of the second bonding structure may be connected to the second bonding vias 195. Lower surfaces of the second metal bonding pads 198 may be substantially coplanar with a lower surface of the second substrate structure S2. The second metal bonding pads 198, also described collectively as a bonding metal layer, which includes a plurality of bonding metal components, may be bonded and connected to the first metal bonding pads 298 of the first substrate structure S1, and the second bonding insulating layer 199 may be bonded and connected to the first bonding insulating layer 299 of the first substrate structure S1. The second bonding vias 195 and the second metal bonding pads 198 may include or be a conductive material, such as copper (Cu). The second bonding insulating layer 199 may include or be, for example, at least one of SiO, SiN, SiCN, SiOC, SiON, and SiOCN.

The first and second substrate structures S1 and S2 may be bonded to each other by bonding between the first metal bonding pads 298 and the second metal bonding pads 198, and bonding between the first bonding insulating layer 299 and the second bonding insulating layer 199. The bonding between the first metal bonding pads 298 and the second metal bonding pads 198 may be, for example, copper (Cu)-to-copper (Cu) bonding. The bonding between the first bonding insulating layer 299 and the second bonding insulating layer 199 may be, for example, dielectric-to-dielectric bonding such as SiCN-to-SiCN bonding. The first and second substrate structures S1 and S2 may be bonded to each other by hybrid bonding including copper (Cu)-to-copper (Cu) bonding and dielectric-to-dielectric bonding.

Figure 4:
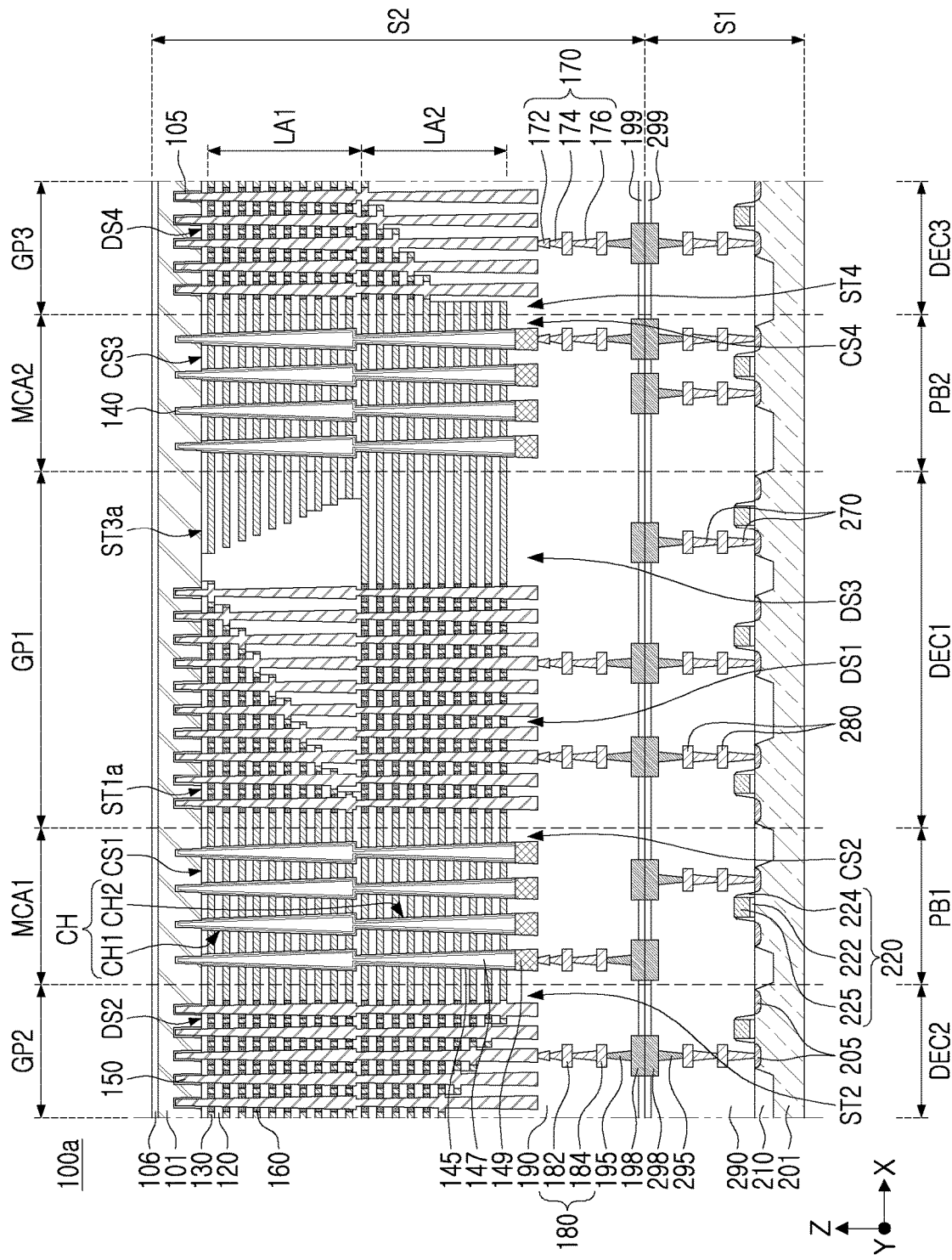
FIGS. 4 and 5 are schematic cross-sectional views of a portion of a semiconductor device according to example embodiments.
Figure 5:
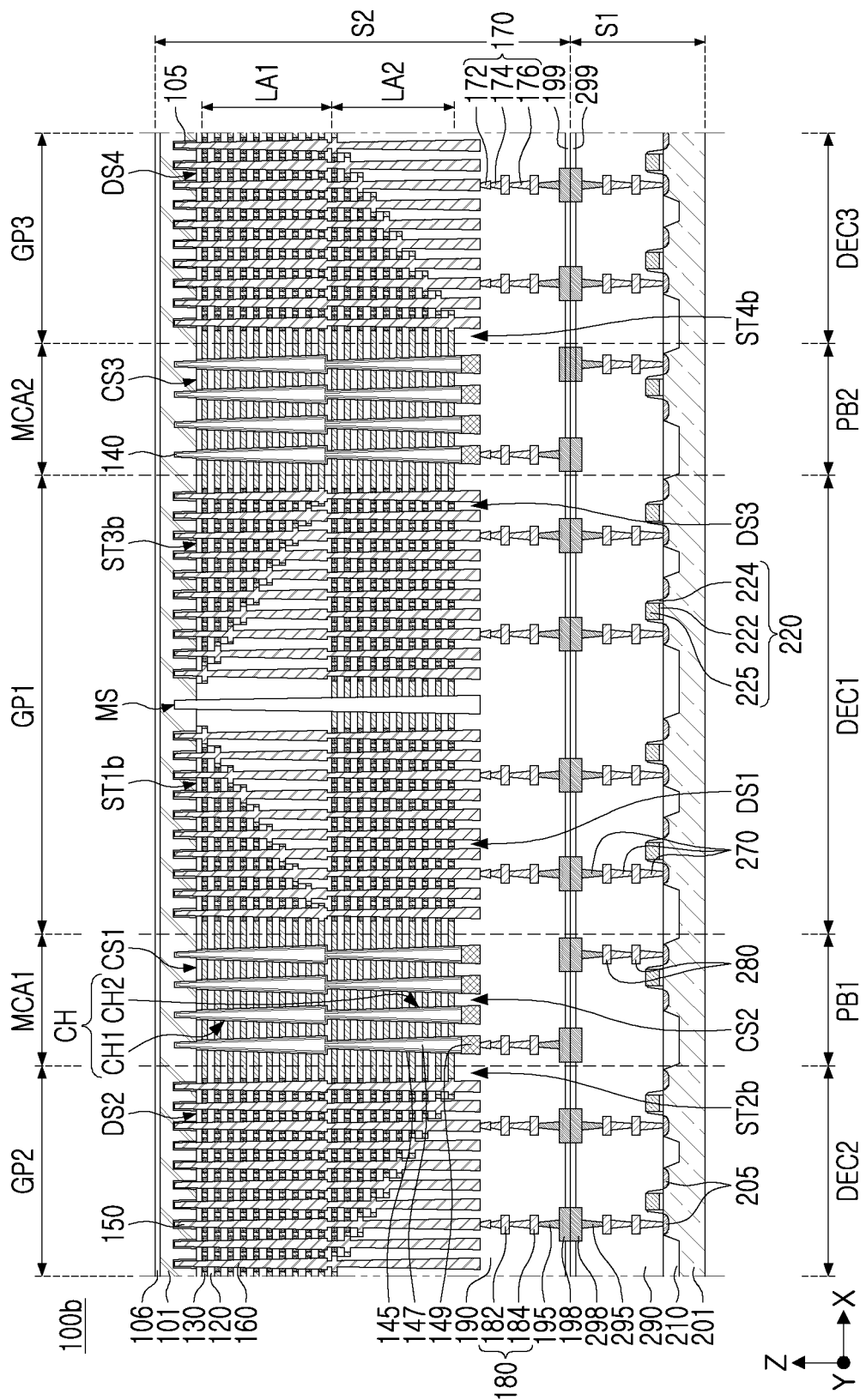

FIGS. 4 and 5 are schematic cross-sectional views of a semiconductor device according to example embodiments.

Referring to FIG. 4, the arrangement of contact plugs 150 in first and third stair structures ST1a and ST3a of a semiconductor device 100a may be different from those of the example embodiments of FIGS. 1 and 2. Specifically, the contact plugs 150 may be respectively connected to the pads PAD of all gate electrodes 130 in the first stair structure ST1a, and may not pass through the third stair structure ST3a. In the present example embodiment, the third stair structure ST3a may be a dummy stair structure in which the contact plugs 150 are not disposed.

A stair structure slope of the of the first stair structure ST1a may be smaller than a stair structure slope of the third stair structure ST3a. Here, the slope refers to an absolute value. That is, the slope of the first stair structure ST1a may be gentler than that of the third stair structure ST3a, which has a steeper slope facilitated by the lack of gate electrodes 130 passing therethrough. Through such a structure, a length of the first gate pad region GP1 in the X-direction may be minimized while providing a relatively wide region in which the first stair structure ST1a is connected to the contact plugs 150.

Referring to FIG. 5, in a semiconductor device 100b, shapes or configurations of the first to fourth stair structures ST1b, ST2b, ST3b, and ST4b may be different from those of the example embodiments of FIGS. 1, 2, and 4. In addition, the second substrate structure S2 may further include an isolation region MS.

The gate electrodes 130 forming the first to fourth stair structures ST1b, ST2b, ST3b, and ST4b may form the overall stair shapes, and all of the pads PAD may be connected to the contact plugs 150.

The isolation region MS may be disposed to pass through the gate electrodes 130 between the first and third stair structures ST1b and ST3b and between first and third dummy structures DS1 and DS3. The isolation region MS may isolate the gate electrodes 130 from each other between the first dummy structure DS1 and the third dummy structure DS3. Accordingly, in the present example embodiment, the gate electrodes 130 forming each of the first and second memory cell regions MCA1 and MCA2 may be isolated from each other. The isolation region MS may include or be one or more insulating materials such as SiO, SiN, SiCN, SiOC, SiON, and SiOCN.

Figure 6:
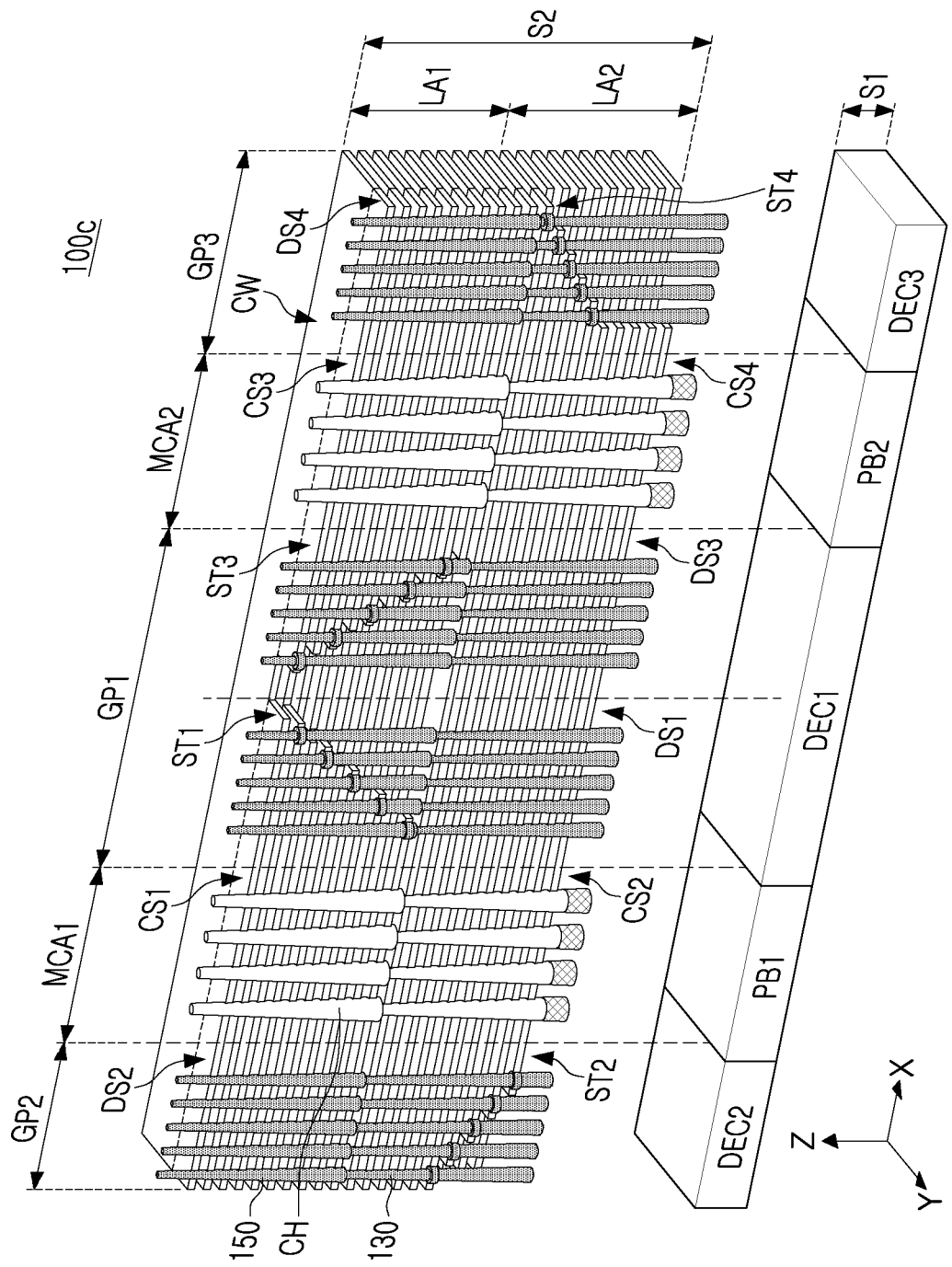
FIG. 6 is a schematic perspective view of a semiconductor device according to example embodiments.

FIG. 6 is a schematic perspective view of a semiconductor device according to example embodiments.

Referring to FIG. 6, in a semiconductor device 100c, a second substrate structure S2 may further include a connection structure CW. The connection structure CW may be a region connecting gate electrodes 130 forming a first memory cell region MCA1 and gate electrodes 130 forming a second memory cell region MCA2 to each other. The connection structure CW may include connection parts extending from each of the gate electrodes 130 in the X- and Y-directions, connecting each of the gate electrodes 130 at the same level.

As illustrated in FIG. 6, the connection structure CW may be disposed on one side of first to fourth cell structures CS1, CS2, CS3, and CS4, first to fourth dummy structures DS1, DS2, DS3, and DS4, and first to fourth stair structures ST1, ST2, ST3, and ST4 that faces in the same Y-direction. However, in other embodiments, the dimension of the connection structure CW in an X-direction may be changed in various manners to facilitate alternative connection arrangements. For example, in some example embodiments, the connection structure CW may not be disposed in a region overlapping second and third gate pad regions GP2 and GP3 in the Y-direction. The connection structure CW may be disposed between memory cell regions in which a common signal is applied to the gate electrodes 130, and may be applied to other example embodiments, for example, the example embodiments of FIGS. 1 to 4.

Figure 7A:
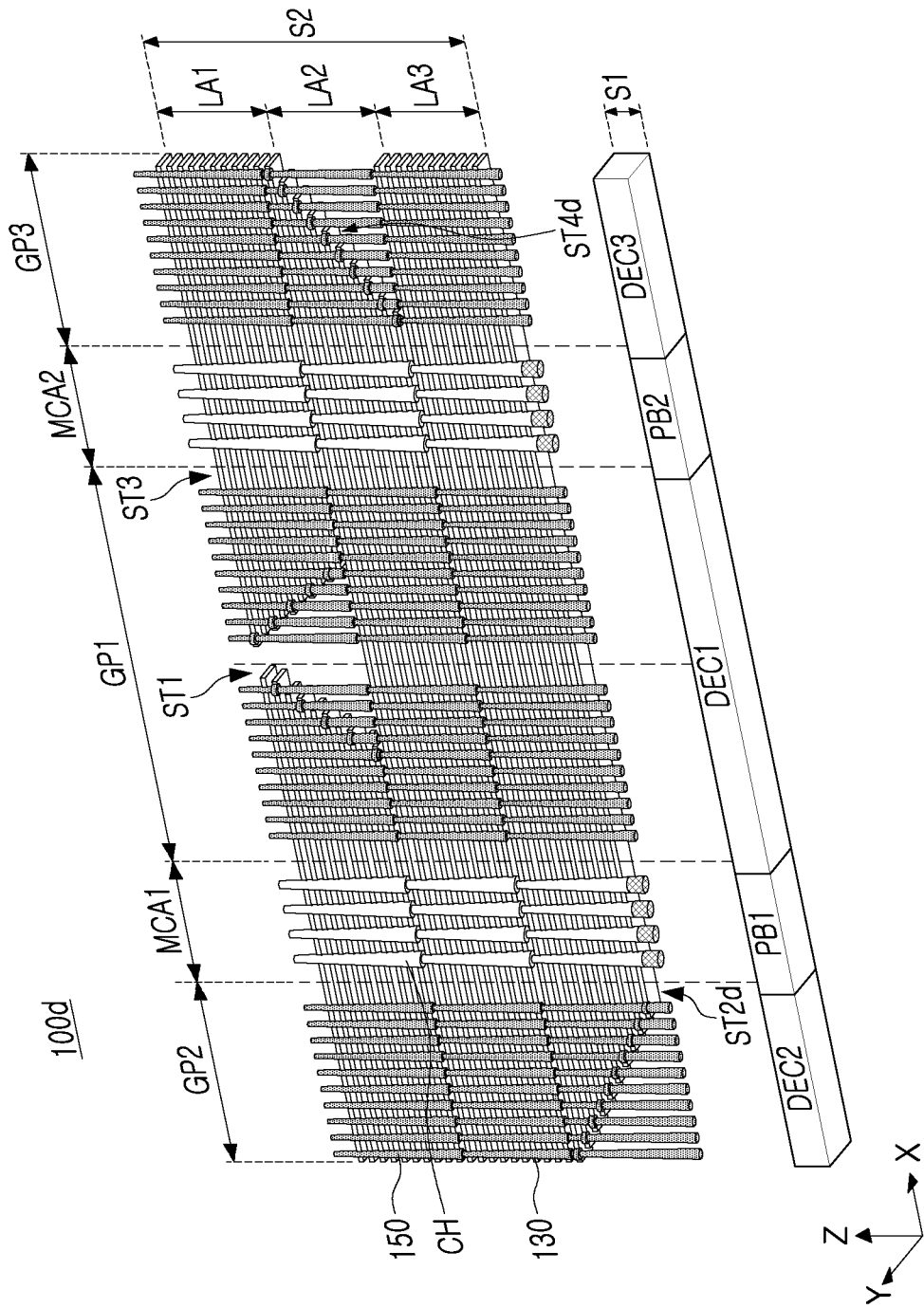
FIGS. 7A and 7B are schematic perspective views of a semiconductor device according to example embodiments.
Figure 7B:
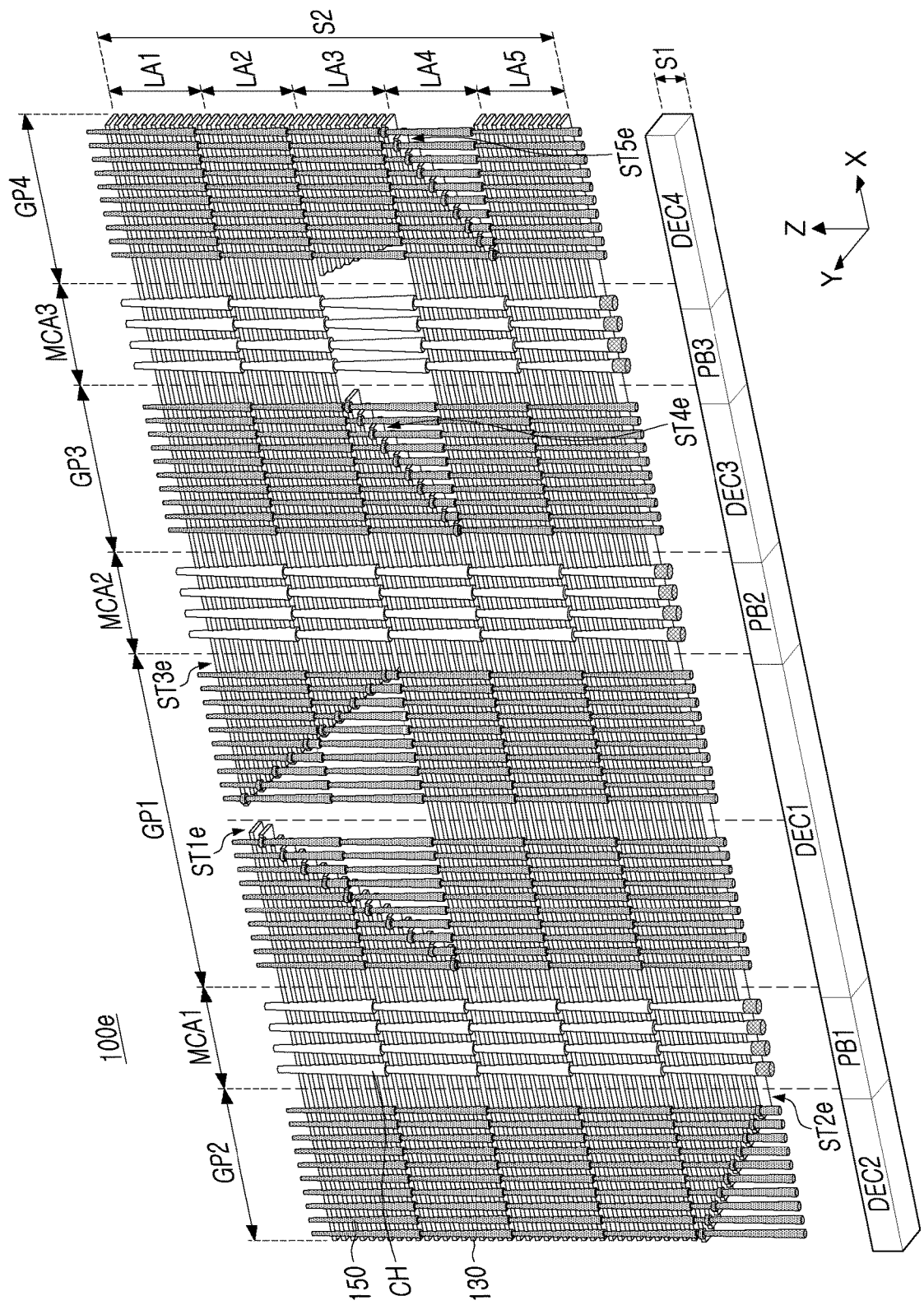

FIGS. 7A and 7B are schematic perspective views of a semiconductor device according to example embodiments.

Referring to FIG. 7A, in a second substrate structure S2 of a semiconductor device 100d, gate electrodes 130 may form first to third stack structures LA1, LA2, and LA3. In the present example embodiment, a fourth stair structure ST4d may form a portion of the second stack structure LA2, and a second stair structure ST2d may form a portion of the third stack structure LA3.

Also in the present example embodiment, first to fourth stair structures ST1, ST2d, ST3, and ST4d may be disposed in different regions, and may not overlap each other in a Z-direction. At least some of the gate electrodes 130 connected to the first to fourth stair structures ST1, ST2d, ST3, and ST4d may be connected to first to third decoder circuit regions DEC1, DEC2, and DEC3 using contact plugs 150.

Referring to FIG. 7B, in a second substrate structure S2 of a semiconductor device 100e, gate electrodes 130 may form first to fifth stack structures LA1, LA2, LA3, LA4, and LA5. A first substrate structure S1 may further include a fourth decoder circuit region DEC4 and a third page buffer circuit region PB3. The second substrate structure S2 may further include a third memory cell region MCA3 and a fourth gate pad region GP4.

In the present example embodiment, first and third stair structures ST1e and ST3e may form portions of the first and second stack structures LA1 and LA2, a fourth stair structure ST4e may form a portion of the third stack structure LA3, a fifth stair structure ST5e may form a portion of the fourth stack structure LA4, and a second stair structure ST2e may form a portion of the fifth stack structure LA5.

Also in the present example embodiment, the first to fifth stair structures ST1e, ST2e, ST3e, ST4e, and ST5e may be disposed in different regions, and may not overlap each other in the Z-direction. At least some of the gate electrodes 130 from each of the first to fifth stair structures ST1e, ST2e, ST3e, ST4e, and ST5e may each be connected to one of first to fourth decoder circuit regions DEC1, DEC2, DEC3, and DEC4 using contact plugs 150.

As the example embodiments of FIGS. 7A and 7B demonstrate, the number of stack structures stacked in the second substrate structure S2 may be changed in various manners, and accordingly, the number and arrangement of stair structures may be changed in various manners.

Figure 8:
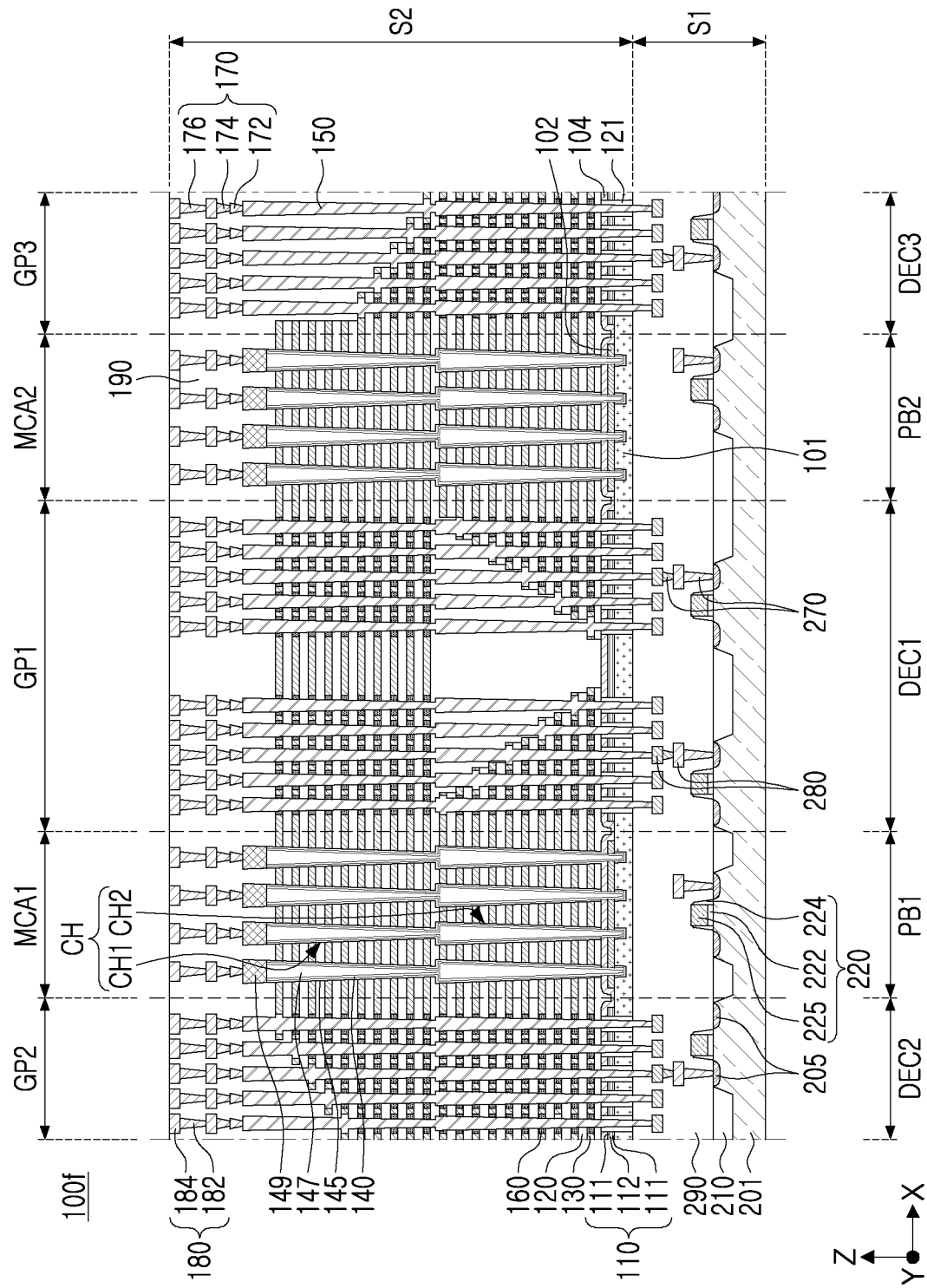
FIG. 8 is a schematic cross-sectional view of a portion of a semiconductor device according to example embodiments.

FIG. 8 is a schematic cross-sectional view of a semiconductor device according to example embodiments.

Referring to FIG. 8, in a semiconductor device 100f, a second substrate structure S2 may have a stacked form without being bonded to the first substrate structure S1 with the use of metal bonding pads. Accordingly, first and second substrate structures S1 and S2 may not include metal bonding structures of the type illustrated for the embodiments in FIGS. 2, 4, and 5. The second substrate structure S2 may have a form in which the structure of the example embodiment of FIG. 2 is vertically inverted. In addition, the second substrate structure S2 may further include first and second horizontal conductive layers 102 and 104, a horizontal insulating layer 110, and substrate insulating layers 121.

The first and second horizontal conductive layers 102 and 104 may be disposed on a lower surface of the plate layer 101 to be sequentially stacked in first and second memory cell regions MCA1 and MCA2. The first horizontal conductive layer 102 may not extend to first to third gate pad regions GP1, GP2, and GP3, and the second horizontal conductive layer 104 may extend to the first to third gate pad regions GP1, GP2, and GP3. The first horizontal conductive layer 102 may function as a portion of a common source line of the semiconductor device 100f, and may function as a common source line together with the plate layer 101, for example. The first horizontal conductive layer 102 may be directly connected to a channel layer 140 that is disposed around a circumference of the channel structure CH. The second horizontal conductive layer 104 may be in contact with the plate layer 101 in some regions in which the first horizontal conductive layer 102 and the horizontal insulating layer 110 are not disposed.

The first and second horizontal conductive layers 102 and 104 may include or be a semiconductor material. For example, both the first and second horizontal conductive layers 102 and 104 may include or be polycrystalline silicon. In this case, at least the first horizontal conductive layer 102 may be a doped layer, and the second horizontal conductive layer 104 may be a doped layer or a layer including impurities diffused from the first horizontal conductive layer 102. However, a material of the second horizontal conductive layer 104 is not limited to a semiconductor material, and may be replaced with an insulating layer. In addition, in some example embodiments, the first and second horizontal conductive layers 102 and 104 and the horizontal insulating layer 110 may be omitted.

The horizontal insulating layer 110 may be disposed on a surface of the plate layer 101 on a level overlapping the first horizontal conductive layer 102 in at least portions of the first to third gate pad regions GP1, GP2, and GP3. The horizontal insulating layer 110 may include first and second horizontal insulating layers 111 and 112 alternately stacked on the plate layer 101. The horizontal insulating layer 110 may be layers remaining after a portion of the horizontal insulating layer 110 is replaced with the first horizontal conductive layer 102 in a process of manufacturing the semiconductor device 100*f*.

The horizontal insulating layer 110 may include or be one or more materials such as silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of a material the same as that of the interlayer insulating layers 120, and the second horizontal insulating layer 112 may be formed of a material different from that of the interlayer insulating layers 120.

The contact plugs 150 may further pass through the second horizontal conductive layer 104, the horizontal insulating layer 110, and the plate layer 101 to extend into the first substrate structure S1. The contact plugs 150 may be electrically isolated from the plate layer 101 and the second horizontal conductive layer 104 by the substrate insulating layer 121. Lower ends of the contact plugs 150 may be connected to uppermost circuit interconnection lines 280.

FIGS. 9A to 9H are schematic cross-sectional views illustrating a method of manufacturing a semiconductor device according to example embodiments.

Figure 9A:
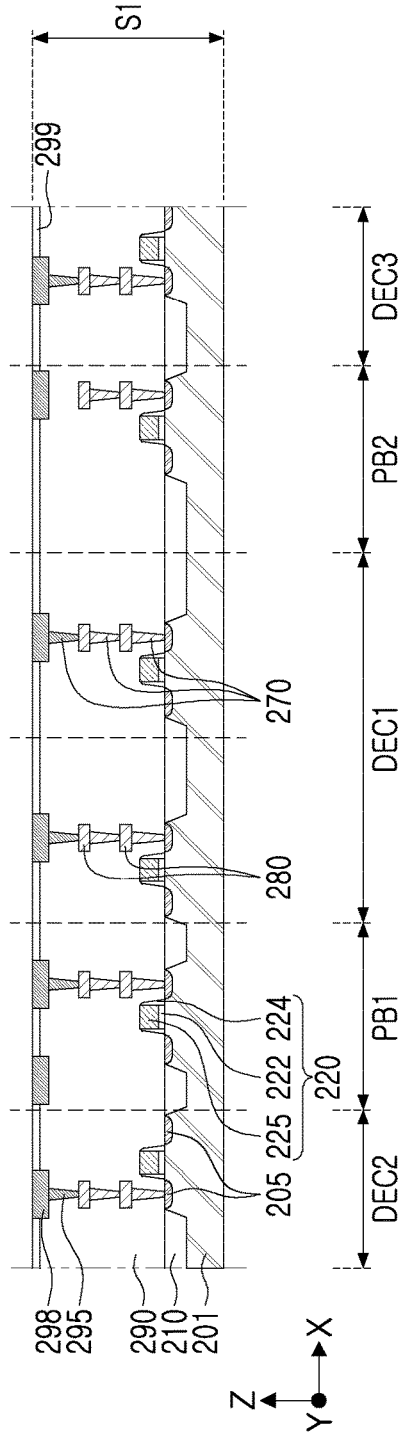
FIGS. 9A to 9H are schematic cross-sectional views illustrating a method of manufacturing a semiconductor device according to example embodiments.

Referring to FIG. 9A, a method of manufacturing a semiconductor device according to example embodiments includes forming a first substrate structure S1, including circuit elements 220, first interconnection structures, and a first bonding structure, on a substrate 201.

First, element isolation layers 210 may be formed in the substrate 201, and a circuit gate dielectric layer 222 and a circuit gate electrode 225 may be sequentially formed on the substrate 201. The element isolation layers 210 may be formed by, for example, a shallow trench isolation (ST1) process. The circuit gate dielectric layer 222 and the circuit gate electrode 225 may be formed using, for example, atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but the present disclosure is not limited thereto. Subsequently, a spacer layer 224 and source/drain regions 205 may be formed on or adjacent both sidewalls of the circuit gate dielectric layer 222 and the circuit gate electrode 225. In some example embodiments, the spacer layer 224 may include a plurality of layers. Subsequently, the source/drain regions 205 may be formed by performing an ion implantation process.

Circuit contact plugs 270 of the first interconnection structure may be formed by forming a portion of a peripheral region insulating layer 290, etching and removing the portion, and filling a conductive material. The circuit interconnection lines 280 of the first interconnection structure may be formed by, for example, depositing a conductive material and then patterning the deposited conductive material.

A first bonding insulating layer 299 of the first bonding structure may be formed on the peripheral region insulating layer 290. First bonding vias 295 and first metal bonding pads 298 of the first bonding structure may be formed after removing portions of the first bonding insulating layer 299 and the peripheral region insulating layer 290.

Through the present operation, the first substrate structure S1 may be prepared.

Figure 9B:
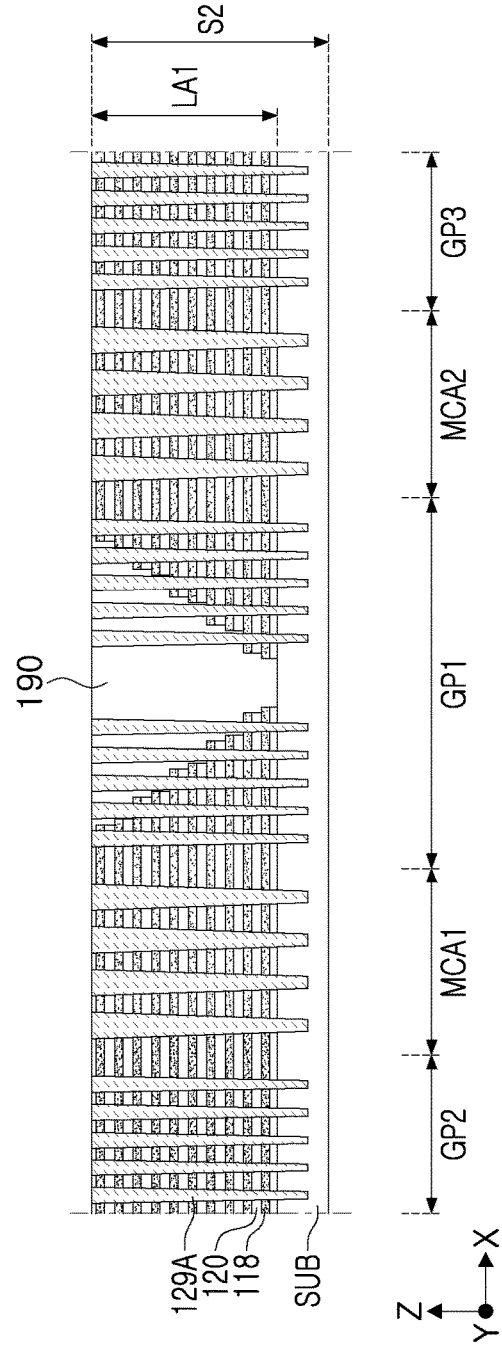

Referring to FIG. 9B, a process of manufacturing the second substrate structure S2 may be started. First, sacrificial insulating layers 118 and interlayer insulating layers 120 forming a first stack structure LA1 may be stacked on a base substrate SUB, and then first vertical sacrificial layers 129A may be formed.

The base substrate SUB, a layer removed through a subsequent process, may be a semiconductor substrate such as silicon (Si).

The sacrificial insulating layers 118 may be layers replaced with the gate electrodes 130 (see FIG. 2) through a subsequent process. The sacrificial insulating layers 118 may be formed of a material that is etchable, with etch selectivity with respect to the interlayer insulating layers 120. For example, the interlayer insulating layer 120 may include or be at least one of silicon oxide and silicon nitride, and the sacrificial insulating layers 118 may include or be a material different from that of the interlayer insulating layer 120, such as from one or more of silicon, silicon oxide, silicon carbide, and silicon nitride. In example embodiments, the thickness of the interlayer insulating layers 120 and the number of films forming the interlayer insulating layers 120 may be changed from those illustrated in various manners.

Subsequently, in a first gate pad region GP1, a photolithography process and an etching process may be repeatedly performed on the sacrificial insulating layers 118 and the interlayer insulating layers 120 such that upper sacrificial insulating layers 118 extend to be shorter than lower sacrificial insulating layers 118 to thereby form a stair structure. Accordingly, the sacrificial insulating layers 118 may form a stair shape. In example embodiments, the sacrificial insulating layers 118 may be formed to have a relatively thick end. Subsequently, a portion of a cell region insulating layer 190, covering lower stack structures of the sacrificial insulating layers 118 and the interlayer insulating layers 120, may be formed.

The first vertical sacrificial layers 129A may be formed by forming lower holes to pass through the first stack structure LA1, in a region corresponding to lower portions of the first channel structures CH1 (see FIG. 2) and the contact plugs 150, and then depositing a material forming the first vertical sacrificial layers 129A in the lower holes. The first vertical sacrificial layers 129A may include, for example, a polycrystalline silicon material, a silicon silicide material, or a carbon-based material.

Figure 9C:
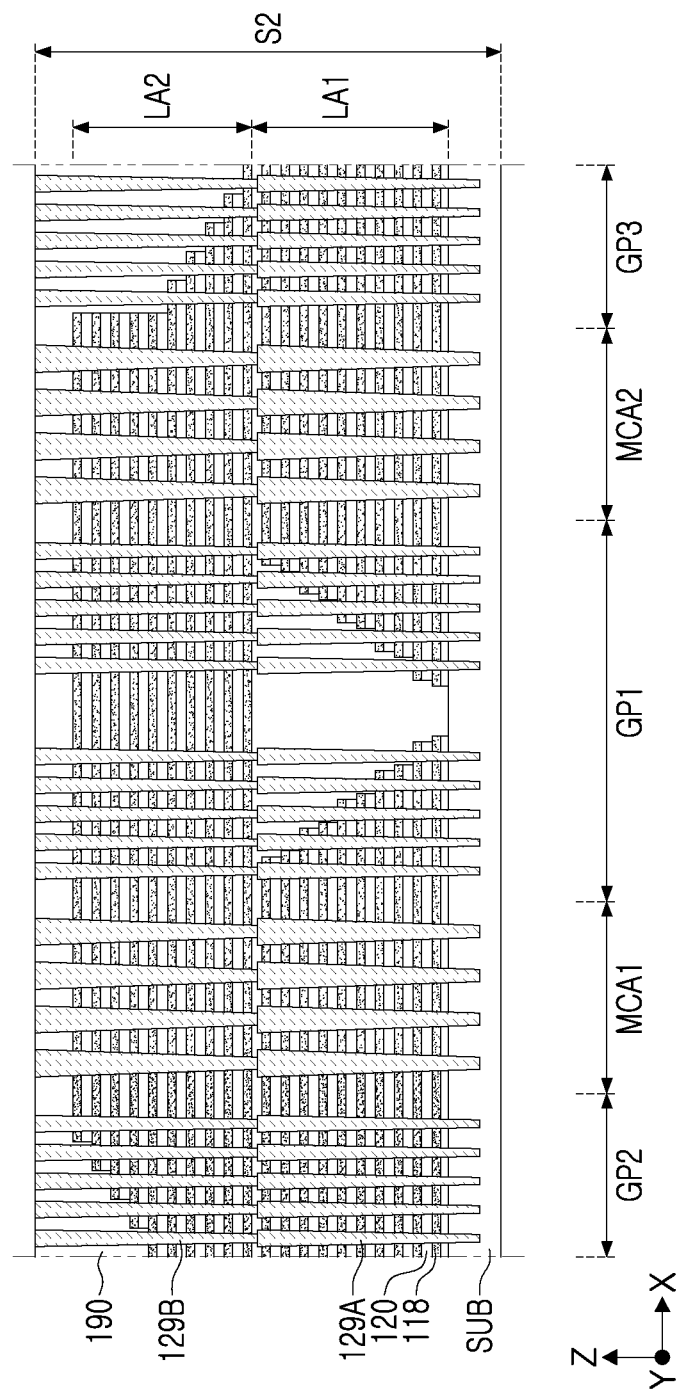

Referring to FIG. 9C, second vertical sacrificial layers 129B may be formed after a second stack structure LA2 is formed on the first stack structure LA1.

The second stack structure LA2 may be formed on the first stack structure LA1 in the same manner (or a variation thereof) as the first stack structure LA1. Subsequently, in a region corresponding to upper portions of the second channel structures CH2 (see FIG. 2) and the contact plugs 150, upper holes may be formed to pass through the second stack structure LA2, and the second vertical sacrificial layers 129B may be formed. The second vertical sacrificial layers 129B may be formed to be connected to the first vertical sacrificial layers 129A, respectively.

As illustrated in FIGS. 9B and 9C, regions in which the sacrificial insulating layers 118 form a stair structure may not overlap each other in a Z-direction. Accordingly, when compared to a case in which one stair structure region is formed, a height of each stair structure may be relatively lowered, thereby reducing a level of process difficulty.

Figure 9D:
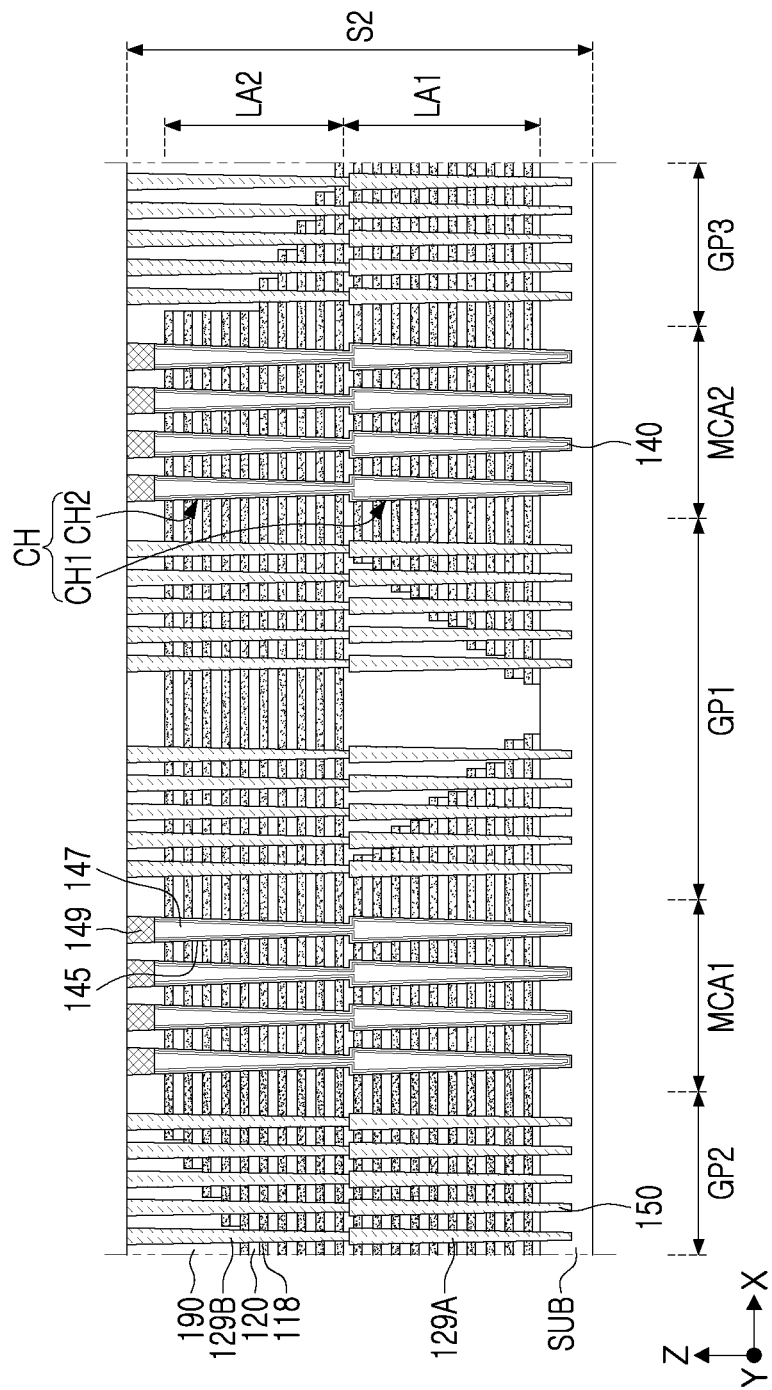

Referring to FIG. 9D, channel structures CH may next be formed.

First, a mask layer, exposing the first and second vertical sacrificial layers 129A and 129B, may be formed in first and second memory cell regions MCA1 and MCA2. Channel holes may be formed by removing the exposed first and second vertical sacrificial layers 129A and 129B. A gate dielectric layer 145, a channel layer 140, a channel filling insulating layer 147, and a channel pad 149 may be sequentially formed in each of the channel holes to form channel structures CH including first and second channel structures CH1 and CH2.

The channel layer 140 may be formed on the gate dielectric layer 145 in the channel structures CH. The channel filling insulating layer 147 may be formed to fill the channel structures CH, and may be an insulating material. However, in some example embodiments, a space between the channel layers 140 may be filled with a conductive material, rather than the channel filling insulating layer 147. The channel pads 149 may be formed of a conductive material, for example polycrystalline silicon.

Figure 9E:
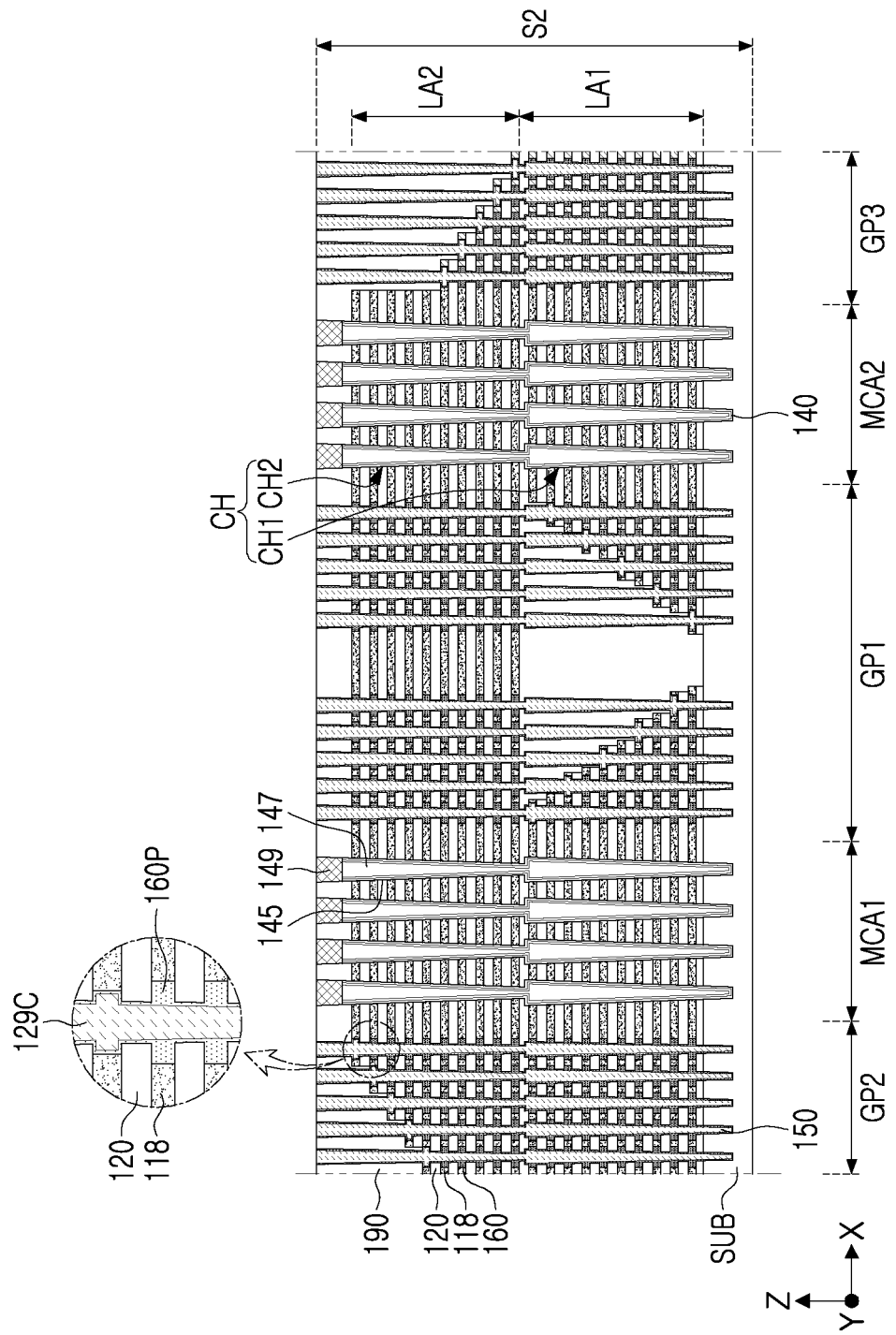

Referring to FIG. 9E, next, preliminary contact insulating layers 160P and third vertical sacrificial layers 129C may be formed.

First, a mask layer, exposing the first and second vertical sacrificial layers 129A and 129B, may be formed in the first to third gate pad regions GP1, GP2, and GP3. Contact holes may be formed by removing the exposed first and second vertical sacrificial layers 129A and 129B. Subsequently, the sacrificial insulating layers 118 exposed through the contact holes may be partially removed. The sacrificial insulating layers 118 may be removed to form tunnel portions, which are extensions that have predetermined lengths extending away from the contact holes. The tunnel portions may be formed to have relatively short lengths in uppermost sacrificial insulating layers 118 and to have a relatively longer lengths in sacrificial insulating layers 118 therebelow.

An insulating material may be deposited in the contact holes and the tunnel portions to form preliminary contact insulating layers 160P. The preliminary contact insulating layers 160P may be formed on sidewalls of the contact holes, and may fill the tunnel portions. As illustrated in the enlarged view in FIG. 9E, in the uppermost sacrificial insulating layers 118, and the preliminary contact insulating layers 160P may not completely fill the tunnel portions.

The third vertical sacrificial layers 129C may be formed on the preliminary contact insulating layers 160P to fill the third vertical sacrificial layers 129C, and to fill the uppermost tunnel portions. The third vertical sacrificial layers 129C may include a material different from that of the preliminary contact insulating layers 160P, and may include or be, for example, polycrystalline silicon.

Figure 9F:
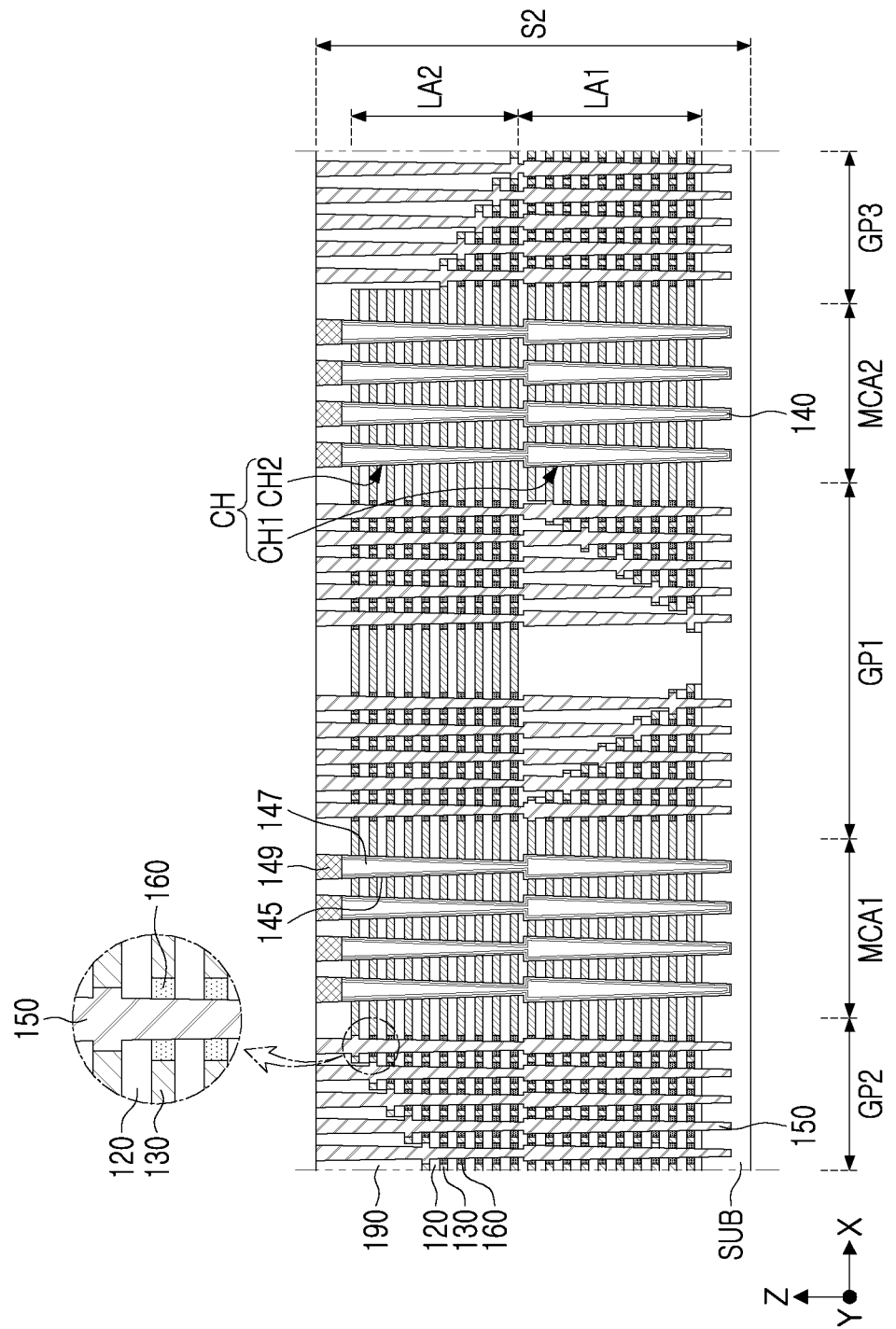

Referring to FIG. 9F, openings may be formed to expose remaining sacrificial insulating layers 118, which subsequently may be removed through the openings. After gate electrodes 130 are formed in a region in which the sacrificial insulating layers 118 are removed, contact plugs 150 may be formed.

For example, the openings used to remove sacrificial insulating layers 118 may be formed as a trench extending in an X-direction above the sacrificial insulating layers 118, which then may be selectively removed with respect to the interlayer insulating layers 120 using, for example, wet etching. Accordingly, tunnel portions may be formed between the interlayer insulating layers 120.

When the gate dielectric layers 145 include a region extending horizontally, the region may be formed before the gate electrodes 130 are formed. The gate electrodes 130 may be formed by filling the tunnel portions with a conductive material. The gate electrodes 130 may be or include, for example, a metal material, a polysilicon material, or a metal silicide material. Subsequently, isolation regions (see, e.g., isolation region MS in FIG. 5) may be formed by filling selected openings with an insulating material.

Referring to FIG. 9E, contact holes may be formed by removing the third vertical sacrificial layers 129C. The third vertical sacrificial layers 129C may be selectively removed with respect to the interlayer insulating layers 120 and the gate electrodes 130. After the third vertical sacrificial layers 129C are removed, the exposed preliminary contact insulating layers 160P may also be partially removed. In this case, the preliminary contact insulating layers 160P may be entirely removed in the pads PAD, and the preliminary contact insulating layers 160P may remain therebelow to form contact insulating layers 160. In the pads PAD, when the gate dielectric layer 145 is exposed after the preliminary contact insulating layers 160P are removed, the gate dielectric layer 145 may also be removed to expose side surfaces of the gate electrodes 130.

Contact plugs 150 then may be formed by depositing a conductive material in the contact holes. In regions where contact plugs 150 horizontally extend in the pads PAD (see FIGS. 2 and 3A), contact plugs 150 thus may be physically and electrically connected to the gate electrodes 130.

Figure 9G:
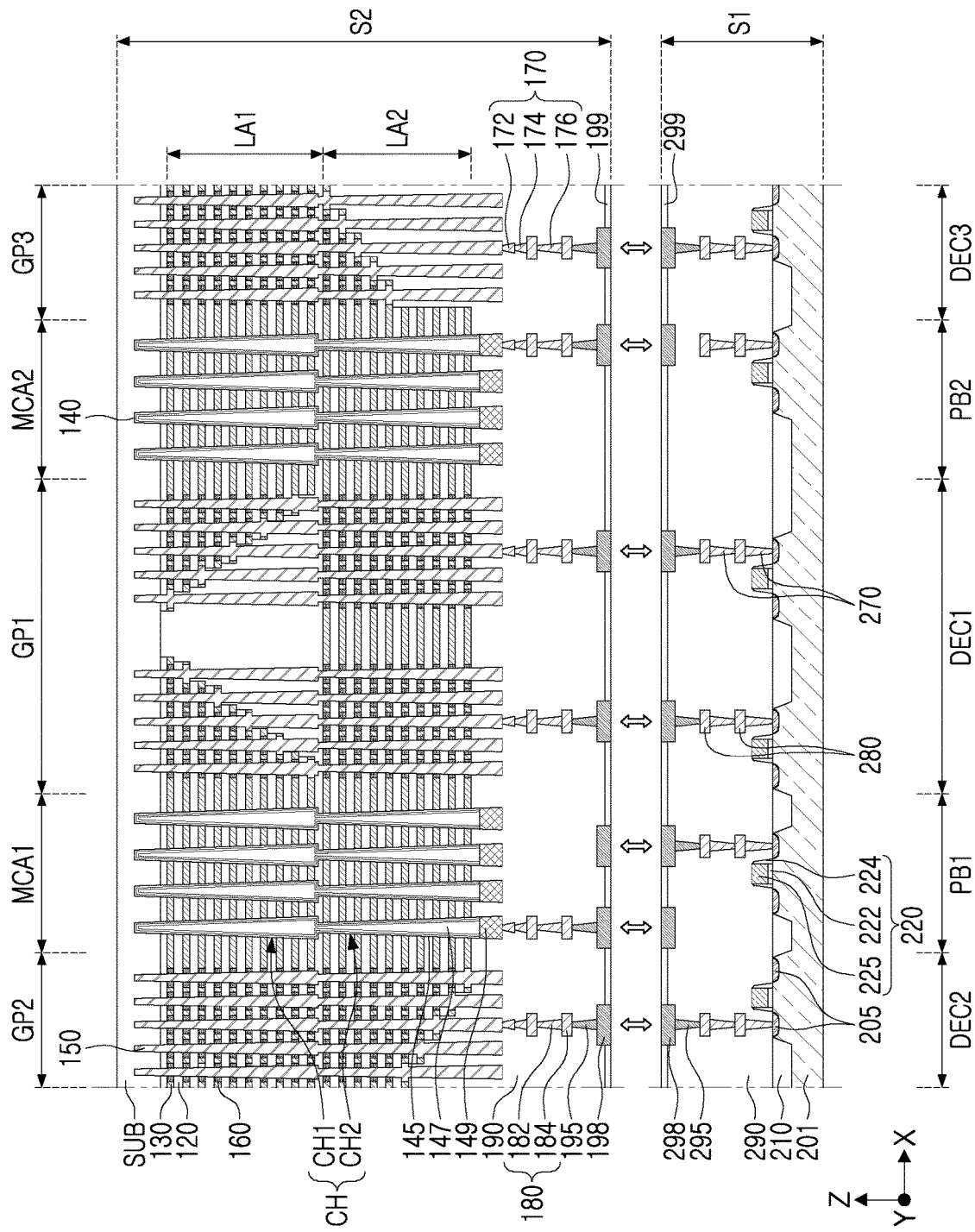

Referring to FIG. 9G, a second interconnection structure comprised of cell contact plugs 170 and cell interconnection lines 180, and a second bonding structure comprised of bonding vias 195 and bonding pads 198, may be formed on the contact plugs 150 that connect with the gate electrodes 130, and the first substrate structure S1 and the second substrate structure S2 may be bonded to each other.

In the second interconnection structure, cell contact plugs 170 may be formed by etching the cell region insulating layer 190 to expose the channel pads 149 and the contact plugs 150 and then depositing a conductive material. Cell interconnection lines 180 may be formed through a process of depositing and patterning a conductive material, or may be formed by partially forming an insulating layer forming the cell region insulating layer 190, patterning the insulating layer, and depositing a conductive material.

Second bonding vias 195 and second metal bonding pads 198, forming the second bonding structure, may be formed by exposing the cell region insulating layer 190 and a second bonding insulating layer 199 on the cell interconnection lines 180, and then partially removing the cell region insulating layer 190 and the second bonding insulating layer 199. Upper surfaces of the second metal bonding pads 198 and an upper surface of the second bonding insulating layer 199 may be disposed over the cell region insulating layer 190.

Subsequently, the first substrate structure S1 and the second substrate structure S2 may be connected to each other by bonding the first metal bonding pads 298 and the second metal bonding pads 198 to each other by, for example, annealing and/or pressing. At the same time, the first bonding insulating layer 299 and the second bonding insulating layer 199 may also be bonded to each other. The second substrate structure S2 may be turned over on the first substrate structure S1 such that the second metal bonding pads 198 face downward, and then bonding may be performed. In the drawings, for ease of understanding, it is illustrated that the bonding surface of second substrate structure S2 is in the form of a mirror image of the bonding surface of first substrate structure S1, having the structure illustrated in FIG. 9F.

The first substrate structure S1 and the second substrate structure S2 may be directly bonded to each other, without an adhesive such as an adhesive layer. In some example embodiments, before bonding is performed, a surface treatment process such as hydrogen plasma treatment may be further performed on the upper surface of the first substrate structure S1 and the lower surface of the second substrate structure S2, in order to enhance bonding strength.

Figure 9H:
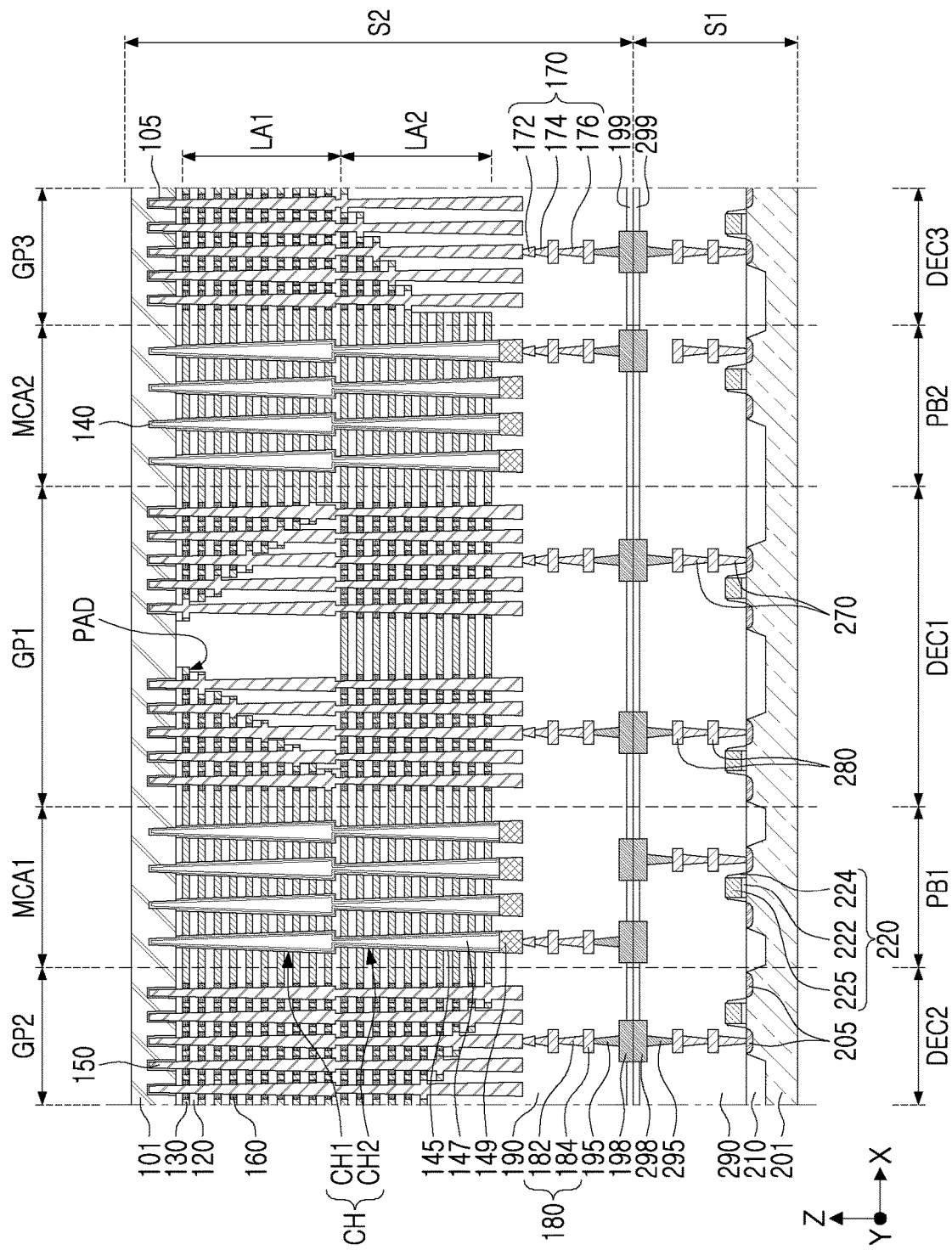

Referring to FIGS. 9B and 9H, the plate layer 101 may in part be formed by removing the base substrate SUB.

A portion of the base substrate SUB may be removed from an upper surface thereof by a polishing process such as a grinding process, and a remaining portion of the base substrate SUB may be removed by an etching process such as a wet etching process. Removing the base substrate SUB of the second substrate structure S2 minimizes or reduces a total thickness of a semiconductor device 100. As the base substrate SUB is removed, upper ends of the channel structures CH and the contact plugs 150 may be exposed.

Channel dielectric layers 145 may be removed from the upper ends of the exposed channel structures CH to expose the conductive channel layers 140. Accordingly, the channel layers 140 may be connected to the plate layer 101. Upper insulating layers 105 may be formed on the upper ends of the contact plugs 150 so they may be electrically isolated from the plate layer 101.

However, in some example embodiments, at least a portion of the base substrate SUB may form the plate layer 101 without being entirely removed. In this case, the channel layers 140 may be electrically connected to the plate layer 101 through a conductive layer disposed on a lower surface of the plate layer 101.

Subsequently, referring to FIG. 2, a passivation layer 106 may be formed on an upper surface of the plate layer 101 to complete manufacture of the semiconductor device 100 of FIG. 2.

Figure 10A:
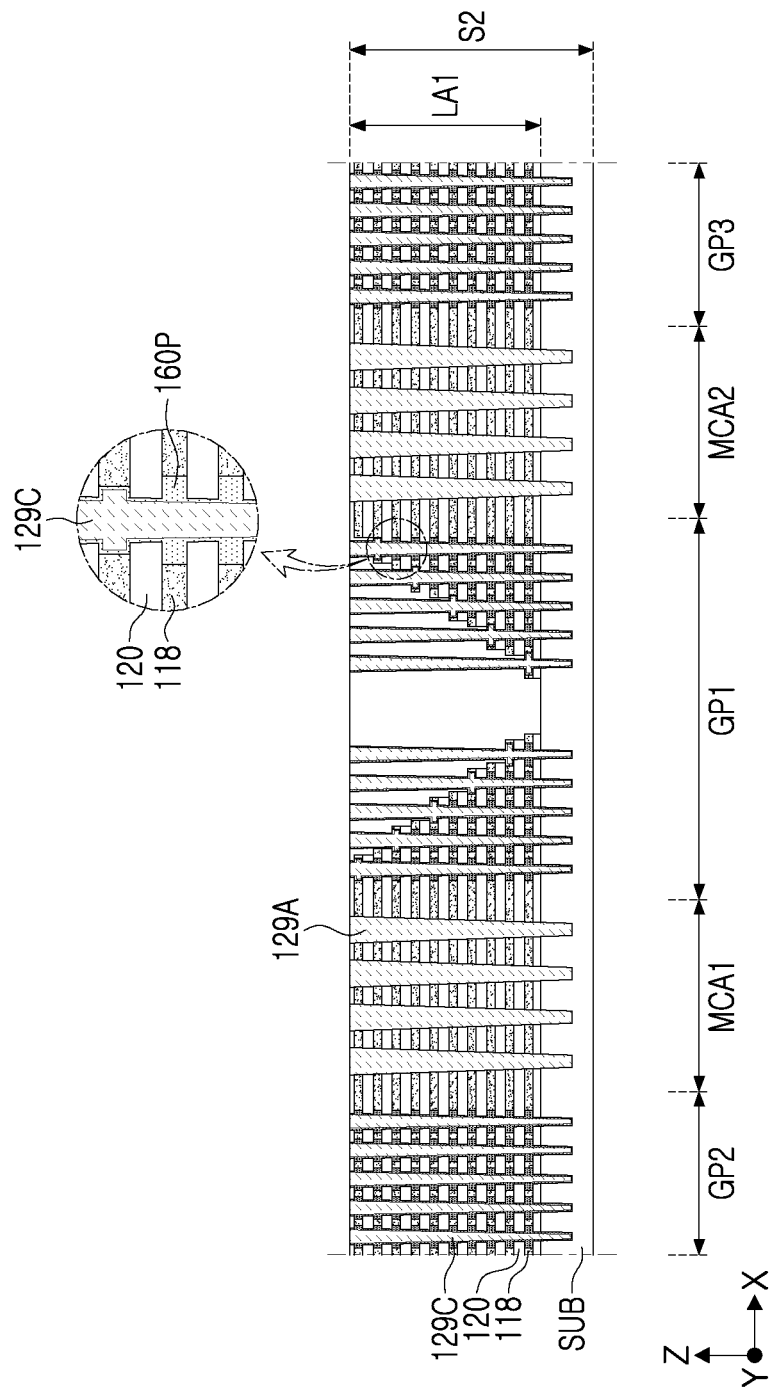
FIGS. 10A and 10B are schematic cross-sectional views illustrating a method of manufacturing a semiconductor device according to example embodiments.
Figure 10B:
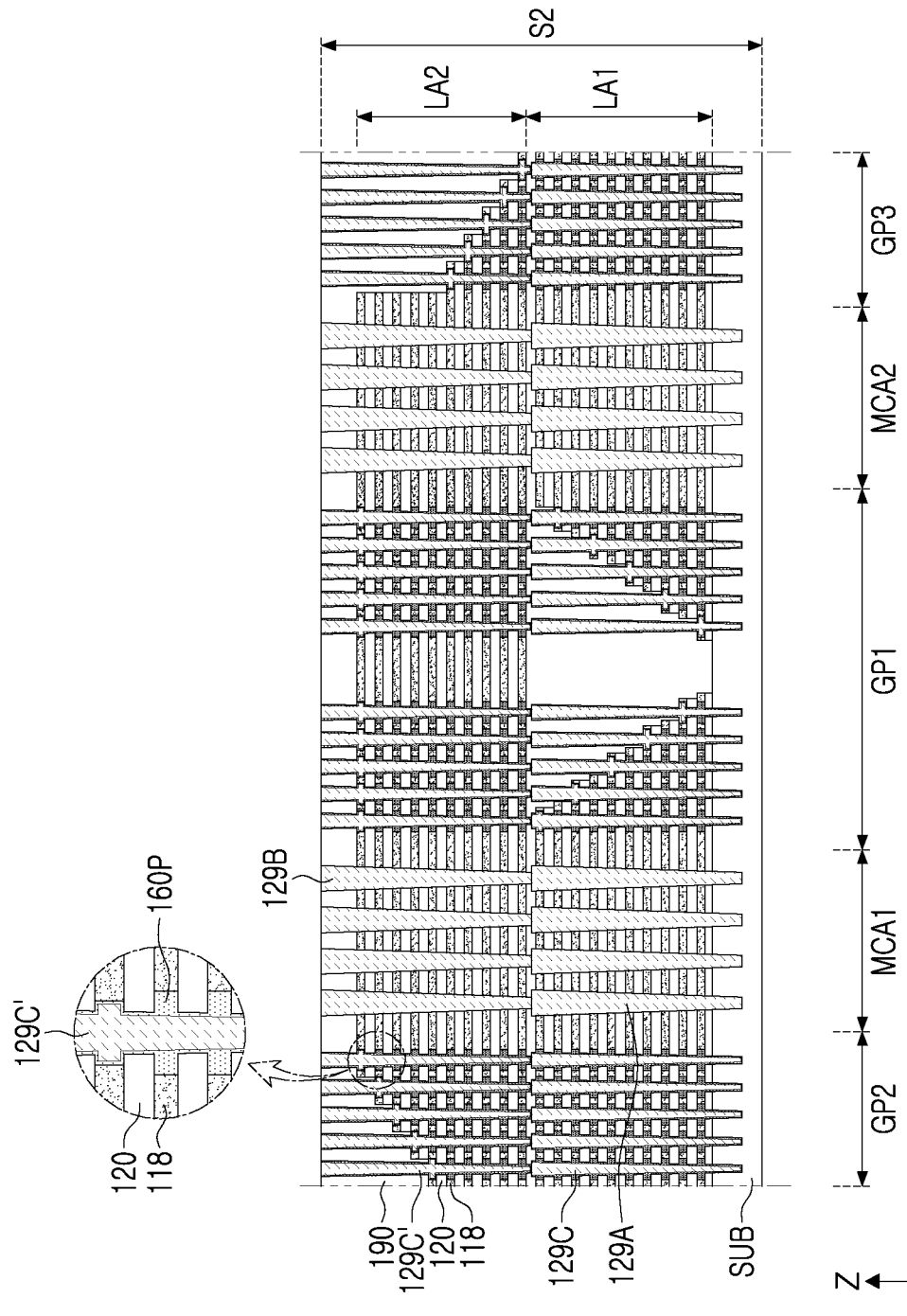

FIGS. 10A and 10B are schematic cross-sectional views illustrating steps of a method of manufacturing a semiconductor device for a second substrate S2 according to example embodiments.

Referring to FIG. 10A, a first stack structure LA1 may be formed on a base substrate SUB and first vertical sacrificial layers 129A may be formed using, for example, the steps discussed above for FIG. 9B. Then some of the first vertical sacrificial layers 129A may be removed and preliminary contact insulating layers 160P and third vertical sacrificial layers 129C may be formed.

First, the first stack structure LA1 and the first vertical sacrificial layers 129A may be formed in the same manner as that described above with reference to FIG. 9B. Subsequently, in a region corresponding to lower portions of the contact plugs 150 (see FIG. 2), the first vertical sacrificial layers 129A may be removed to form lower contact holes, and then the preliminary contact insulating layers 160P and the third vertical sacrificial layers 129C may be formed. The preliminary contact insulating layers 160P and the third vertical sacrificial layers 129C may be formed through a process the same as that described above with reference to FIG. 9E.

Referring to FIG. 10B, a second stack structure LA2 and a second vertical sacrificial layers 129B next may be formed, and then some of the second vertical sacrificial layers 129B may be removed to form preliminary contact insulating layers 160P and fourth vertical sacrificial layers 129C'.

First, the second stack structure LA2 and the second vertical sacrificial layers 129B may be formed through a process the same as that described above with reference to FIG. 9C. In first to third gate pad regions GP1, GP2, and GP3, the second vertical sacrificial layers 129B may be formed on the fourth vertical sacrificial layers 129C' therebelow.

Subsequently, in a region corresponding to upper portions of the contact plugs 150 (see FIG. 2), upper contact holes may be formed by removing the second vertical sacrificial layers 129B, and then the preliminary contact insulating layers 160P and the fourth vertical sacrificial layers 129C' may be formed. The preliminary contact insulating layers 160P and the fourth vertical sacrificial layers 129C' may be formed through a process the same as that described above with reference to FIG. 9E.

Subsequently, the semiconductor device 100 of FIG. 2 may be manufactured by performing the processes described above with reference to FIGS. 9D and 9F to 9H.

Figure 11:
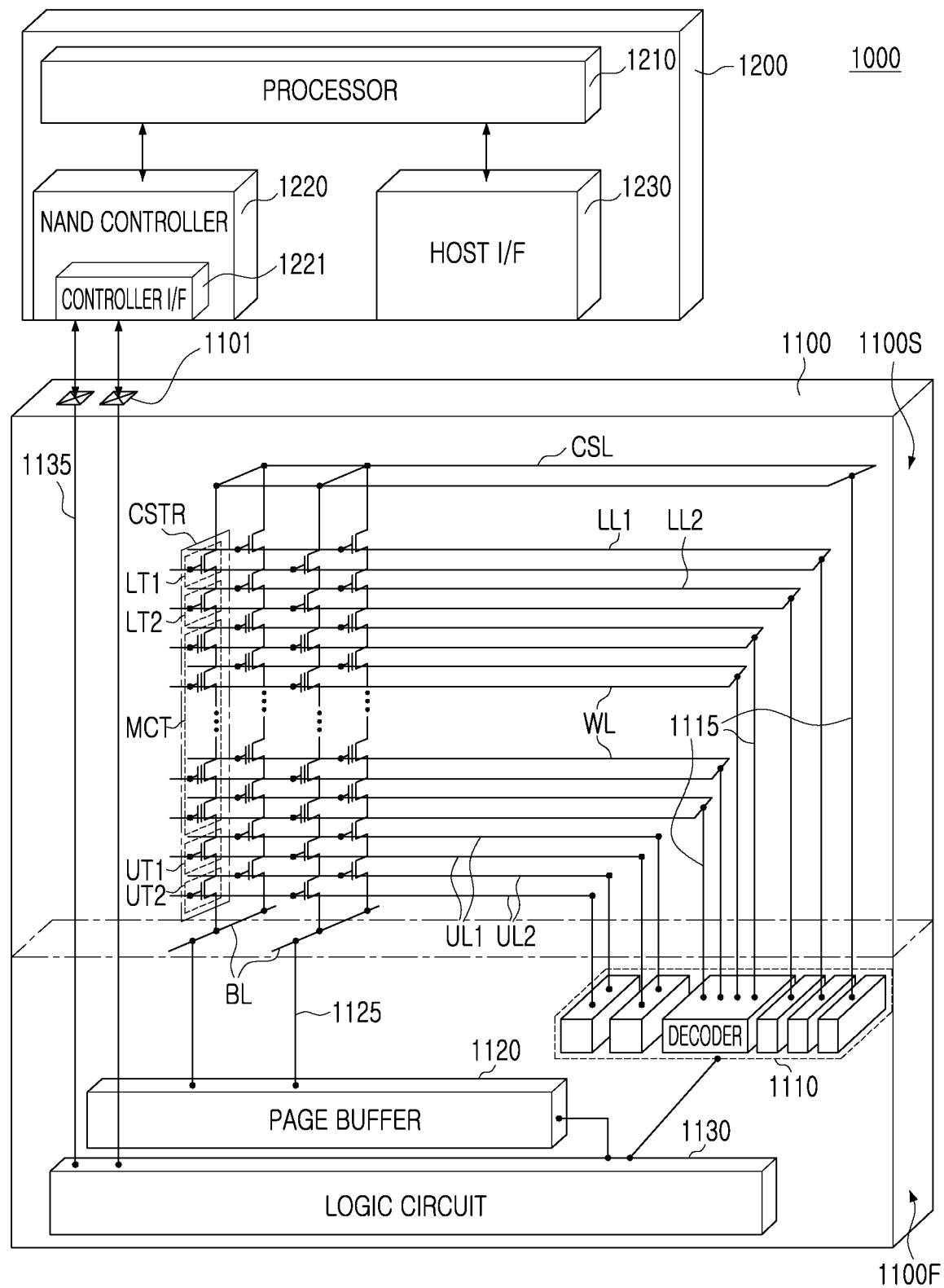
FIG. 11 is a schematic diagram illustrating a data storage system including a semiconductor device according to example embodiments.

FIG. 11 is a schematic diagram illustrating a data storage system including a semiconductor device according to example embodiments.

Referring to FIG. 11, a data storage system 1000 may include a semiconductor device 1100 and a controller 1200 electrically connected to the semiconductor device 1100. The data storage system 1000 may be a storage device including one or a plurality of semiconductor devices 1100 or an electronic device including the storage device. For example, the data storage system 1000 may be a solid-state drive (SSD) device including one or a plurality of semiconductor devices 1100 as well as one or more other devices or systems for use therewith, such as a universal serial bus (USB), a computing system, a medical device, or a communication device.

The semiconductor device 1100 may be a non-volatile memory device, and may be, for example, a NAND flash memory device incorporating features described above with reference to FIGS. 1 to 8. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR that is coupled to and between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. In some example embodiments, the number of lower transistors LT1 and LT2 and the number of upper transistors UT1 and UT2 may be modified in various manners.

In example embodiments, the upper transistors UT1 and UT2 may be string selection transistors, and the lower transistors LT1 and LT2 may be ground selection transistors. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 connected in series. The upper transistors UT1 and UT2 may include a string selection transistor UT1 and an upper erase control transistor UT2 connected in series. At least one of the lower erase control transistors LT1 and the upper erase control transistor UT2 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from an interior of the first structure 1100F to the second structure 1100S. The bit lines BL may be electrically connected to the page buffer 1120 through second connection interconnections 1125 extending from the interior of the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection interconnection 1135 extending from the interior of the first structure 1100F to the second structure 1100S.

The controller 1200 may include a processor 1210, a NAND controller 1220, and a host interface 1230. In some example embodiments, the data storage system 1000 may include a plurality of semiconductor devices 1100. In this case, the controller 1200 may control the plurality of semiconductor devices 1100.

The processor 1210 may control an overall operation of the data storage system 1000 including the controller 1200. The processor 1210 may operate according to predetermined firmware, and may access the semiconductor device 1100 by controlling the NAND controller 1220. The NAND controller 1220 may include a NAND interface 1221 processing communication with the semiconductor device 1100. A control instruction for controlling the semiconductor device 1100, data to be written in the memory cell transistors MCT of the semiconductor device 1100, data to be read from the memory cell transistors MCT of the semiconductor device 1100, and the like may be transmitted through the NAND interface 1221. The host interface 1230 may provide a communication function between the data storage system 1000 and an external host. When a control instruction is received from the external host through the host interface 1230, the processor 1210 may control the semiconductor device 1100 in response to the control instruction.

Figure 12:
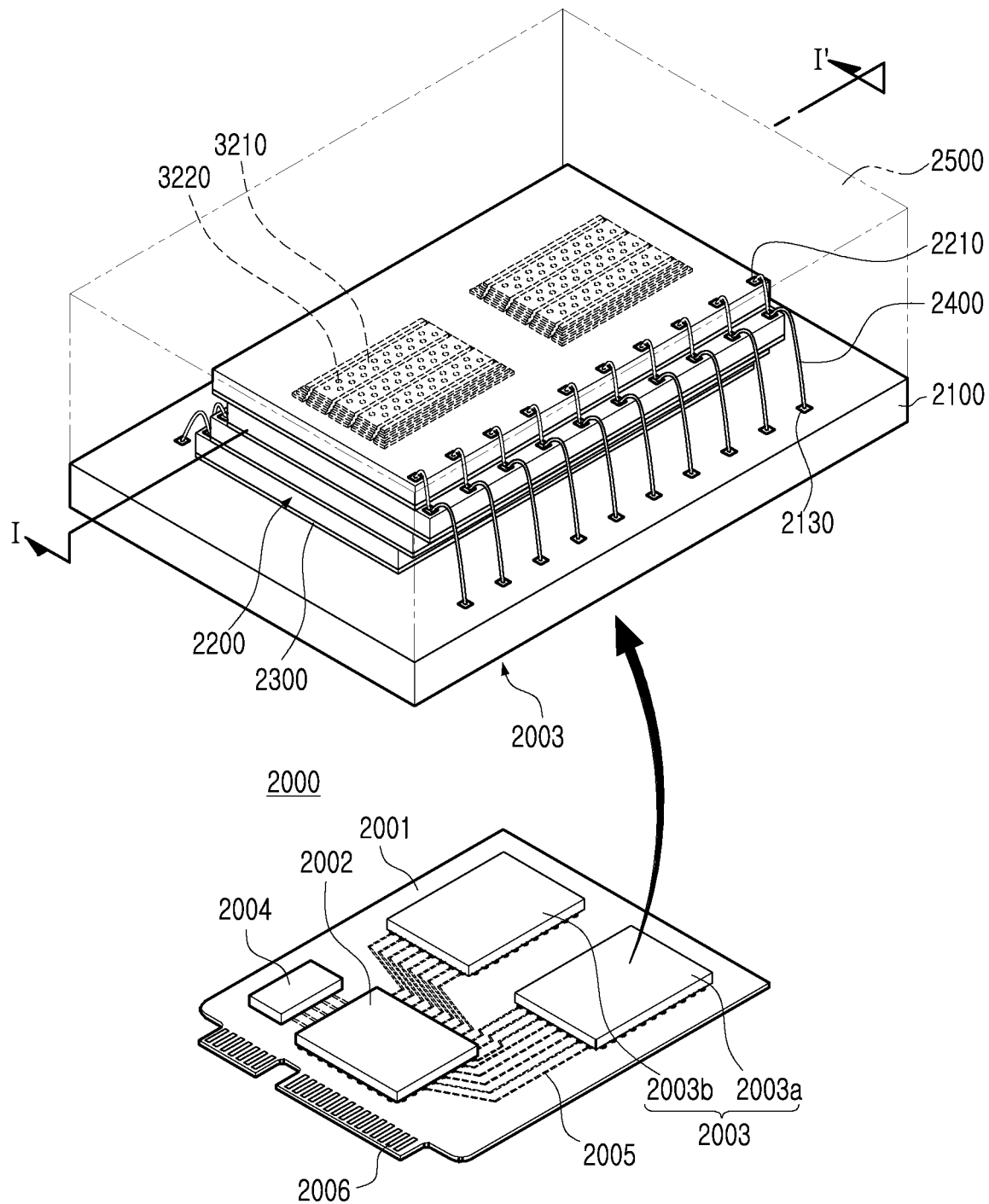
FIG. 12 is a schematic perspective view of a data storage system including a semiconductor device according to an example embodiment.

FIG. 12 is a schematic perspective view of a data storage system including a semiconductor device according to an example embodiment.

Referring to FIG. 12, a data storage system 2000 according to an example embodiment of the present disclosure may include a main substrate 2001, a controller 2002 mounted on the main substrate 2001, one or more semiconductor packages 2003, and a DRAM 2004. The semiconductor packages 2003 and the DRAM 2004 may be connected to the controller 2002 through interconnection patterns 2005 formed on the main substrate 2001.

The main substrate 2001 may include a connector 2006 including a plurality of pins for coupling to an external host. The number and arrangement of the plurality of pins in the connector 2006 may vary depending on a communication interface between the data storage system 2000 and the external host. In example embodiments, the data storage system 2000 may communicate with the external host according to prescribed interfaces such as universal flash storage (UFS), peripheral component interconnect express (PCI-Express), serial advanced technology attachment (SATA), M-Phy for universal serial bus (USB), and the like. In example embodiments, the data storage system 2000 may be operated by power supplied from the external host through the connector 2006. The data storage system 2000 may further include a power management integrated circuit (PMIC) for distributing power supplied from the external host to the controller 2002 and a semiconductor package 2003.

The controller 2002 may write data in the semiconductor package 2003 or read data from the semiconductor package 2003, and may improve the operating speed of the data storage system 2000.

The DRAM 2004 may be a buffer memory for alleviating a speed difference between the semiconductor package 2003, a data storage space, and the external host. The DRAM 2004, included in the data storage system 2000, may also operate as a type of cache memory, and may provide a space for temporarily storing data in a control operation on the semiconductor package 2003. When the DRAM 2004 is included in the data storage system 2000, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 11. Each of the semiconductor chips 2200 may include gate stack structures 3210 and channel structures 3220. Each of the semiconductor chips 2200 may include a semiconductor device as described above with reference to FIGS. 1 to 8.

In example embodiments, the connection structure 2400 may be a bonding wire electrically connecting the input/output pad 2210 and the package upper pads 2130 to each other. Accordingly, in each of the first and second semiconductor packages 2003a and 2003b, the semiconductor chips 2200 may be electrically connected to each other using a bonding wire method, and may be electrically connected to the package upper pads 2130 of the package substrate 2100. In some example embodiments, in each of the first and second semiconductor packages 2003a and 2003b, the semiconductor chips 2200 may be electrically connected to each other by a connection structure such as a through-silicon via (TSV), instead of the connection structure 2400 using the bonding wire method.

In example embodiments, the controller 2002 and the semiconductor chips 2200 may be included in one package. In an example embodiment, the controller 2002 and the semiconductor chips 2200 may be mounted on an interposer substrate, different from the main substrate 2001, and the controller 2002 and the semiconductor chips may be connected to each other by an interconnection formed on the interposer substrate.

Figure 13:
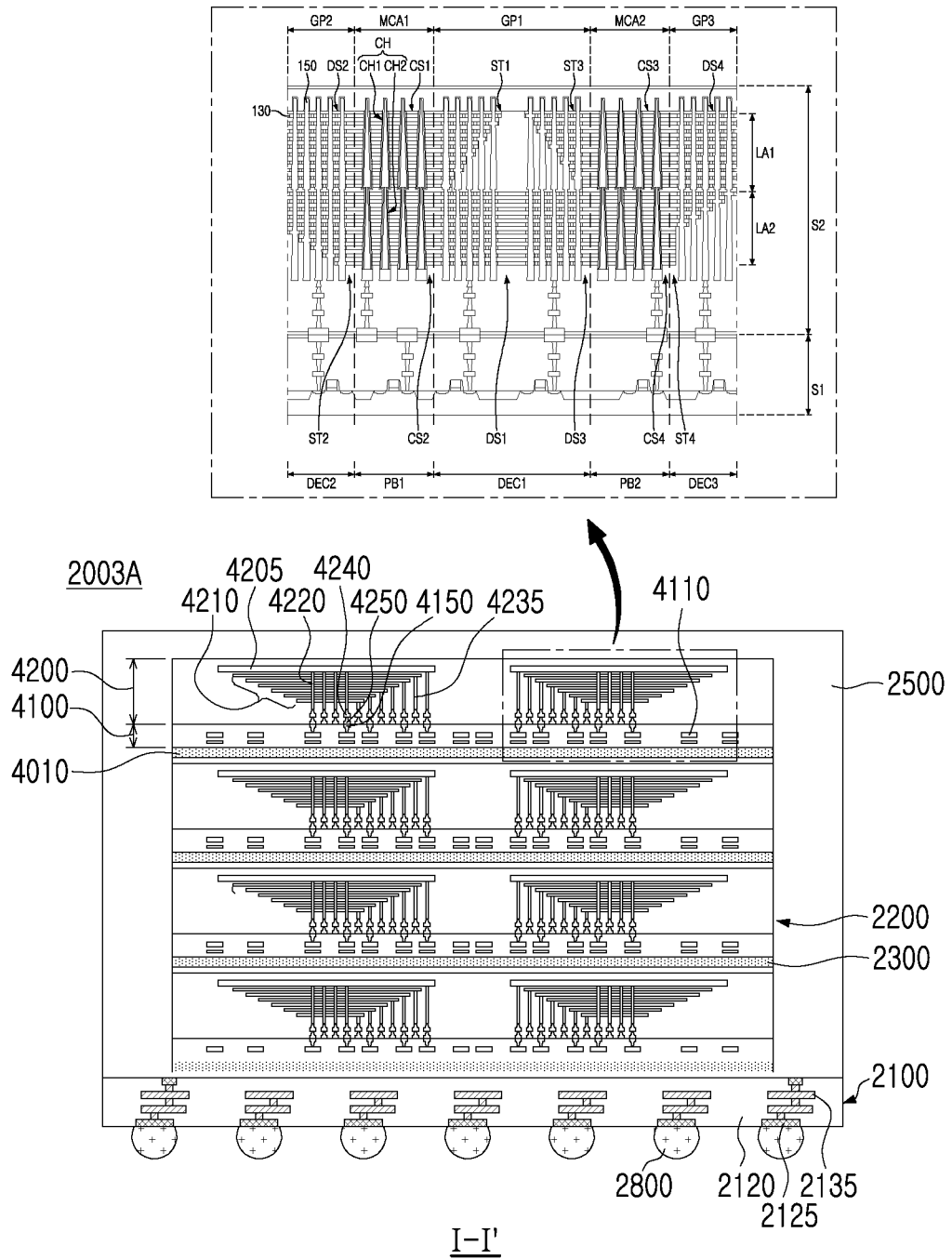
FIG. 13 is a schematic cross-sectional view along line I-I' from FIG. 12 of a semiconductor package according to an example embodiment.

FIG. 13 is a schematic cross-sectional view of a semiconductor package according to an example embodiment. FIG. 13 illustrates an example embodiment of the semiconductor package 2003 of FIG. 12, and schematically illustrates a region obtained by cutting the semiconductor package 2003 of FIG. 12 along line I-I'.

Referring to FIG. 13, in a semiconductor package 2003A, the package substrate 2100 may be a printed circuit board. The package substrate 2100 includes a package substrate body 2120, package upper pads 2130 (see FIG. 12), package lower pads 2125 disposed on or exposed through a lower surface of the package substrate body 2120, and internal interconnections 2135 electrically connecting the package upper pads 2130 and the package lower pads 2125 inside the package substrate body 2120. The package lower pads 2125 may be connected to the interconnection patterns 2005 of the main board 2001 of the data storage system 2000 as shown in FIG. 12 through conductive connection parts 2800.

In the semiconductor package 2003A, each of the semiconductor chips 2200 may include a semiconductor substrate 4010, a first structure 4100 on the semiconductor substrate 4010, and a second structure 4200 bonded to the first structure 4100 using, for example, a wafer bonding technique).

The first structure 4100 may include a peripheral circuit region including a peripheral interconnection 4110 and first bonding structures 4150. The second structure 4200 may include a common source line 4205, a gate stack structure 4210 between the common source line 4205 and the first structure 4100, channel structures 4220 and an isolation region 4230 passing through the gate stack structure 4210, and second bonding structures 4250 electrically connected to word lines (WL of FIG. 11) of memory channel structures 4220 and the gate stack structure 4210, respectively. For example, the second bonding structures 4250 may be electrically connected to the memory channel structures 4220 and the word lines, respectively, through bit lines 4240 electrically connected to the memory channel structures 4220 and the contact plugs 150 electrically connected to the word lines. The first bonding structures 4150 of the first structure 4100 and the second bonding structures 4250 of the second structure 4200 may be bonded to and in electrical contact with each other. Bonded portions of the first bonding structures 4150 and the second bonding structures 4250 may be formed of, for example, copper (Cu).

As illustrated in the enlarged view, in the second structure 4200, the first and second stair structures ST1 and ST2 are in different regions, with the first and second cell structures CS1 and CS2 interposed therebetween.

The semiconductor chips 2200 may be electrically connected to each other by connection structures 2400 being in the form of bonding wires (see FIG. 12). However, in other embodiments, semiconductor chips in one semiconductor package, such as the semiconductor chips 2200, may be electrically connected to each other by an alternative connection structure, including by a through-silicon via (TSV).

In a structure in which a plurality of stack structures including gate electrodes are stacked, the arrangement of pads of gate electrodes, connected to contact plugs, may be optimized, thereby providing a semiconductor device having improved mass production and a data storage system including the same.

The various and beneficial advantages and effects of the present disclosure are not limited to those set forth herein. Thus, while example embodiments have been shown and described above, it will be apparent to those skilled in the art that modifications and variations can be made without departing from the scope of the present disclosure.

What is claimed is:

1. A semiconductor device comprising:
a first substrate structure including a first decoder circuit region, a second decoder circuit region, a page buffer circuit region between the first decoder circuit region and the second decoder circuit region, and a top surface facing in a first direction; and
a second substrate structure connected to the first substrate structure and on the top surface of the first substrate structure, wherein the second substrate structure includes:
a plate layer having a lower surface facing the top surface of the first substrate structure;
a first cell structure below the plate layer, the first cell structure including a plurality of first gate electrodes stacked on and spaced apart from each other in the first direction, a first side facing in a second direction perpendicular to the first direction, and a second side opposite the first side;
a second cell structure below the first cell structure, the second cell structure including a plurality of second gate electrodes stacked on and spaced apart from each other in the first direction, a first side facing in the second direction, and a second side opposite the first side;
a first stair structure adjacent to one of the first sides of the first and second cell structures, the first stair structure having portions of at least two of the first gate electrodes extending from the first cell structure to different lengths in the second direction;
a second stair structure adjacent to one of the second sides of the first and second cell structures, the second stair structure having portions of at least two of the second gate electrodes extending from the second cell structure to different lengths in the second direction;
a first dummy structure below the first stair structure, the first dummy structure having portions of the second gate electrodes extending in the second direction;
a plurality of first contact plugs passing through the first stair structure and the first dummy structure, the first contact plugs respectively connected to the at least two first gate electrodes; and a plurality of second contact plugs passing through the second stair structure, the second contact plugs respectively connected to the at least two second gate electrodes, and wherein the first stair structure overlaps the first decoder circuit region in the first direction, and the second stair structure overlaps the second decoder circuit region in the first direction.

2. The semiconductor device of claim 1, wherein
the second substrate structure further includes a second dummy structure above the second stair structure, the second dummy structure having portions of at least one first gate electrode extending in the second direction, and
the second contact plugs pass through the second dummy structure.

3. The semiconductor device of claim 1, wherein
each of the first and second decoder circuit regions includes a plurality of pass transistors,
at least one of the first gate electrodes is electrically connected to one of the pass transistors of the first decoder circuit region through one of the first contact plugs, and
at least one of the second gate electrodes is electrically connected to one of the pass transistors of the second decoder circuit region through one of the second contact plugs.

4. The semiconductor device of claim 1, wherein the first decoder circuit region includes:
a plurality of pass transistors electrically connected to the first gate electrodes, respectively;
a first interconnection structure including circuit interconnection lines and a plurality of circuit contact plugs electrically connected to the pass transistors; and
a first bonding structure on the first interconnection structure, the first bonding structure including a plurality of first metal bonding pads.

5. The semiconductor device of claim 4, wherein at least some of the first contact plugs are disposed to overlap the circuit contact plugs electrically connected thereto in the first direction.

6. The semiconductor device of claim 4, wherein the second substrate structure further includes:
a second interconnection structure below the first and second contact plugs, the second interconnection structure including a plurality of circuit interconnection lines and a plurality of circuit contact plugs connected to the first and second contact plugs; and
a second bonding structure below the second interconnection structure, the second bonding structure including second metal bonding pads connected to the first metal bonding pads.

7. The semiconductor device of claim 1, wherein lower surfaces of the first and second contact plugs are coplanar.

8. The semiconductor device of claim 1, wherein upper ends of the first and second contact plugs extend into the plate layer.

9. The semiconductor device of claim 1, wherein each of the first contact plugs has a bent portion between the first stair structure and the first dummy structure.

10. The semiconductor device of claim 1, wherein the second substrate structure further includes:
a third cell structure spaced apart from the first stair structure in the second direction, the third cell structure including a plurality of third gate electrodes stacked on and spaced apart from each other in the first direction;

a fourth cell structure below the third cell structure, the fourth cell structure including a plurality of fourth gate electrodes stacked on and spaced apart from each other in the first direction; and
a third stair structure between the first stair structure and the third cell structure, the third stair structure having portions of at least three of the third gate electrodes extending from the third cell structure to different lengths in the second direction.

11. The semiconductor device of claim 10, wherein
the second substrate structure further includes a third dummy structure below the third stair structure, the third dummy structure having portions of the fourth gate electrodes extending in the second direction, and
the second gate electrodes are each connected to one of the fourth gate electrodes between the first dummy structure and the third dummy structure.

12. The semiconductor device of claim 10, wherein the second substrate structure further includes a connection structure connecting the first gate electrodes and the third gate electrodes to each other, and respectively connecting the second gate electrodes and the fourth gate electrodes to each other.

13. The semiconductor device of claim 10, wherein the first stair structure and the third stair structure have different stair structure slopes.

14. The semiconductor device of claim 1, wherein a stair structure height of the first stair structure is different from a stair structure height of the second stair structure.

15. The semiconductor device of claim 1, wherein
the second substrate structure further includes channel structures passing through the first and second cell structures, and
lower ends of the channel structures are coplanar with level of lower ends of the first and second contact plugs.

16. A semiconductor device comprising:
a first substrate structure including a first decoder circuit region, a second decoder circuit region, a page buffer circuit region between the first decoder circuit region and the second decoder circuit region, and a top surface facing in a vertical direction; and
a second substrate structure connected to the first substrate structure and disposed on the first substrate structure,
wherein the second substrate structure includes:
a first cell structure including a plurality of first gate electrodes stacked in a vertical and spaced apart configuration;
a second cell structure including a plurality of second gate electrodes disposed below the first cell structure, the second gate electrodes stacked in a vertical and spaced apart configuration;
a first stair structure horizontally disposed to a first side of the first and second cell structures, the first stair structure including portions of at least some of the first gate electrodes extending horizontally from the first cell structure to different lengths within the first stair structure;
a second stair structure horizontally disposed to a second side of the first and second cell structures opposite the first side, the second stair structure including portions of at least some of the second gate electrodes extending horizontally from the second cell structure to different lengths within the second stair structure;

a plurality of first contact plugs passing vertically through the first stair structure, each of the first contact plugs respectively connected to a different one of the first gate electrodes; and a plurality of second contact plugs passing vertically through the second stair structure, each of the second contact plugs respectively connected to a different one of the second gate electrodes, wherein, in the first stair structure, a length of an upper first gate electrode is longer than a length of a lower first gate electrode, among the first gate electrodes, and in the second stair structure, a length of an upper second gate electrode is longer than a length of a lower second gate electrode, among the second gate electrodes.

17. The semiconductor device of claim 16, wherein the first and second cell structures vertically overlap the page buffer circuit region.

18. The semiconductor device of claim 16, wherein the first stair structure vertically overlaps the first decoder circuit region, and the second stair structure vertically overlaps the second decoder circuit region.

19. A data storage system comprising:

a semiconductor storage device including a first substrate structure including circuit elements and first metal bonding pads, a second substrate structure including a plurality of vertically stacked gate electrodes and second metal bonding pads connected to the first metal bonding pads, and an input/output pad electrically connected to the circuit elements; and a controller electrically connected to the semiconductor storage device through the input/output pad, the controller configured to control the semiconductor storage device, wherein the second substrate structure includes:

a plate layer;

a first cell structure including a plurality first gate electrodes vertically stacked and spaced apart from each other;

a second cell structure below the first cell structure, the second cell structure including a plurality of second gate electrodes vertically stacked and spaced apart from each other;

a first stair structure horizontally disposed adjacent to a first side of the first and second cell structures, the first stair structure including portions of at least some of the first gate electrodes extending horizontally from the first cell structure to different lengths;

a second stair structure horizontally disposed adjacent to a second side of the first and second cell structures opposite the first side, the second stair structure including portions of at least some of the second gate electrodes extending horizontally from the second cell structure to different lengths;

a plurality of first contact plugs passing vertically through the first stair structure, each of the first contact plugs respectively connected to one of the first gate electrodes; and a plurality of second contact plugs passing vertically through the second stair structure, each of the second contact plugs respectively connected to one of the second gate electrodes, and wherein upper ends of the first and second contact plugs extend vertically above the lower surface of the plate layer.

20. The data storage system of claim 19, wherein the second substrate structure further includes a dummy structure below the first stair structure, the dummy structure includes horizontally extending portions of the second gate electrodes, and the first contact plugs pass vertically through the dummy structure.

* * * * *